United States Patent
Yabuuchi et al.

(10) Patent No.: US 9,455,022 B2
(45) Date of Patent: Sep. 27, 2016

(54) SEMICONDUCTOR INTEGRATED CIRCUIT DEVICE

(71) Applicant: Renesas Electronics Corporation, Kanagawa (JP)

(72) Inventors: Makoto Yabuuchi, Kanagawa (JP); Hidehiro Fujiwara, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 55 days.

(21) Appl. No.: 14/334,790

(22) Filed: Jul. 18, 2014

(65) Prior Publication Data
US 2015/0029784 A1 Jan. 29, 2015

(30) Foreign Application Priority Data

Jul. 25, 2013 (JP) ................................. 2013-154883

(51) Int. Cl.
*G11C 5/14* (2006.01)
*G11C 11/417* (2006.01)
*G11C 11/418* (2006.01)
*G11C 11/419* (2006.01)
*G11C 17/12* (2006.01)

(52) U.S. Cl.
CPC ............ *G11C 11/417* (2013.01); *G11C 11/418* (2013.01); *G11C 11/419* (2013.01); *G11C 17/12* (2013.01)

(58) Field of Classification Search
CPC . G11C 11/417; G11C 11/418; G11C 11/419; G11C 17/12
USPC ......................................... 365/226, 228, 154
See application file for complete search history.

(56) References Cited

U.S. PATENT DOCUMENTS

| 5,541,529 | A | * | 7/1996 | Mashiko | ............ | H03K 19/0013 326/38 |
| 6,498,761 | B2 | * | 12/2002 | Banba | ..................... | G11C 5/145 365/185.18 |
| 7,408,830 | B2 | * | 8/2008 | Lee | ....................... | G11C 11/417 365/189.09 |
| 7,474,583 | B2 | * | 1/2009 | Yamamura | ............. | G11C 5/145 365/154 |
| 8,659,969 | B2 | * | 2/2014 | Fujiwara | ................ | G11C 16/20 365/201 |
| 2012/0020145 | A1 | * | 1/2012 | Huber | ..................... | G06F 21/72 365/154 |
| 2016/0148664 | A1 | * | 5/2016 | Katoh | ................ | G11C 13/0059 365/148 |
| 2016/0148679 | A1 | * | 5/2016 | Yoshimoto | ........... | G11C 13/004 365/148 |

FOREIGN PATENT DOCUMENTS

| JP | 2012-043517 A | 3/2012 |
| JP | 2012-073954 A | 4/2012 |

* cited by examiner

*Primary Examiner* — Viet Q Nguyen
(74) *Attorney, Agent, or Firm* — Sughrue Mion, PLLC

(57) ABSTRACT

There is provided a semiconductor integrated circuit device that can generate a unique ID with the suppression of overhead. When a unique ID is generated, the potential of a word line of a memory cell in an SRAM is raised above the power supply voltage of the SRAM, and then lowered below the power supply voltage of the SRAM. When the potential of the word line is above the power supply voltage of the SRAM, the same data is supplied to both the bit lines of the memory cell. Thereby, the memory cell in the SRAM is put into an undefined state and then changed so as to hold data according to characteristics of elements or the like configuring the memory cell. In the manufacture of the SRAM, there occur variations in characteristics of elements or the like configuring the memory cell. Accordingly, the memory cell in the SRAM holds data according to variations occurring in the manufacture.

8 Claims, 14 Drawing Sheets

"1" data

NONVOLATILE CELL

"0" data

NONVOLATILE CELL

ID GENERATION CELL

SEMICONDUCTOR INTEGRATED CIRCUIT DEVICE

CROSS-REFERENCE TO RELATED APPLICATIONS

The disclosure of Japanese Patent Application No. 2013-154883 filed on Jul. 25, 2013 including the specification, drawings and abstract is incorporated herein by reference in its entirety.

BACKGROUND

The present invention relates to a semiconductor integrated circuit device, and particularly to a semiconductor integrated circuit device incorporating a memory circuit and a microprocessor.

There is a semiconductor integrated circuit device incorporating memory circuits and a microprocessor (hereinafter referred to as a CPU). For example, there is a semiconductor integrated circuit device referred to as the so-called SoC (System on a Chip) obtained by forming memory circuits and a CPU in one semiconductor chip. Such a semiconductor integrated circuit device is used in many fields.

Recently, the market for electronic commerce services carried out over the Internet such as e-commerce and Internet banking has been steadily expanding. Further, electronic money services using IC cards are already in widespread use and are entering a period of expansion. Many semiconductor integrated circuit devices are also used in these electronic commerce services and electronic money services. Particularly in these services, money and/or personal information are dealt with; therefore, a higher level of security is always required. Accordingly, for semiconductor integrated circuit devices used in these services, a higher level of security is also required.

Security techniques include a software-level technique and a hardware-level technique. At the software level, for example by an encryption technique centered on a strong encryption algorithm, a higher level of security is going to be achieved. On the other hand, at the hardware level as well, attempts have been made to physically implement an encryption algorithm. However, there is pointed out a possibility of permitting an attacker such as the so-called hacker (cracker) to decrypt a secret key.

At the time of manufacturing a semiconductor integrated circuit device, an ID (Identification) is stored in a fuse or a nonvolatile memory circuit incorporated therein. In this case, there is pointed out a problem that there is a risk that data stored at the time of manufacture is falsified in actual use or a possibility that the semiconductor chip itself is cloned.

In order to solve such a problem, there is a proposal to generate an ID unique to a semiconductor integrated circuit device, focusing on variations occurring at the time of manufacturing the semiconductor integrated circuit device. For example, in a semiconductor chip where field-effect transistors (hereinafter referred to as MOSFETs) are formed as elements, there is a proposal to generate an ID (unique ID) unique to the semiconductor chip, using variations of MOSFETs occurring during manufacturing. In accordance with such a proposal, it is possible to generate a physically unclonable semiconductor chip unique ID (PUF: Physical Unclonable Function).

SUMMARY

Japanese Unexamined Patent Publication No. 2012-43517 (Patent Document 1) discloses a technique for creating a unique ID, using an address where an error occurs in a memory test performed by a memory BIST 104 at a supply voltage to a memory 103 which is reduced from that during a normal operation (FIG. 7). Japanese Unexamined Patent Publication No. 2012-73954 (Patent Document 2) discloses a technique for creating a unique ID, using data read from an SRAM memory cell after writing initial data to the SRAM memory cell and then writing "Low" to both bit lines of the SRAM memory cell at the same time.

In the technique disclosed in Patent Document 1, a configuration for controlling the power supply voltage of the memory 103 is required, which might cause overhead. Further, since the memory BIST 104 performs the memory test, it might take time to create the unique ID. In the technique disclosed in Patent Document 2, it is required that "Low" is written to both the bit lines at the same time, which might cause overhead.

The other problems and novel features will become apparent from the description of this specification and the accompanying drawings.

According to one embodiment, when a unique ID is generated, the potential of a word line of a memory cell in an SRAM (Static Random Access Memory) is raised above the power supply voltage of the SRAM, and then lowered below the power supply voltage of the SRAM. When the potential of the word line is above the power supply voltage of the SRAM, the same data ("High" or "Low") is supplied to both the bit lines of the memory cell. Thereby, the memory cell in the SRAM is put into an undefined state (destroyed state) and then changed so as to hold data according to characteristics of elements or the like configuring the memory cell. In the manufacture of the SRAM, there occur variations in characteristics of elements or the like configuring the memory cell. Accordingly, the memory cell in the SRAM holds data according to variations occurring in the manufacture. That is, the unique ID is generated and stored in the memory cell in the SRAM.

According to the one embodiment, when the unique ID is generated, the voltage applied to the word line of the memory cell in the SRAM is generated by a booster circuit. This makes it possible to suppress overhead in circuit size and operating speed.

There is a case where a relatively high potential is supplied to the word line of the memory cell in the SRAM when data is written to the memory cell. This is to assist in writing data to the memory cell in the SRAM, but not to generate and store the unique ID in the memory cell. Further, due to the technique for assistance in writing, mutually different voltages ("High or "Low") according to data to be written are supplied to both the bit lines when the relatively high potential is supplied to the word line.

According to the one embodiment, it is possible to provide a semiconductor integrated circuit device that can generate the unique ID with the suppression of overhead.

DETAILED DESCRIPTION

Figure 1:
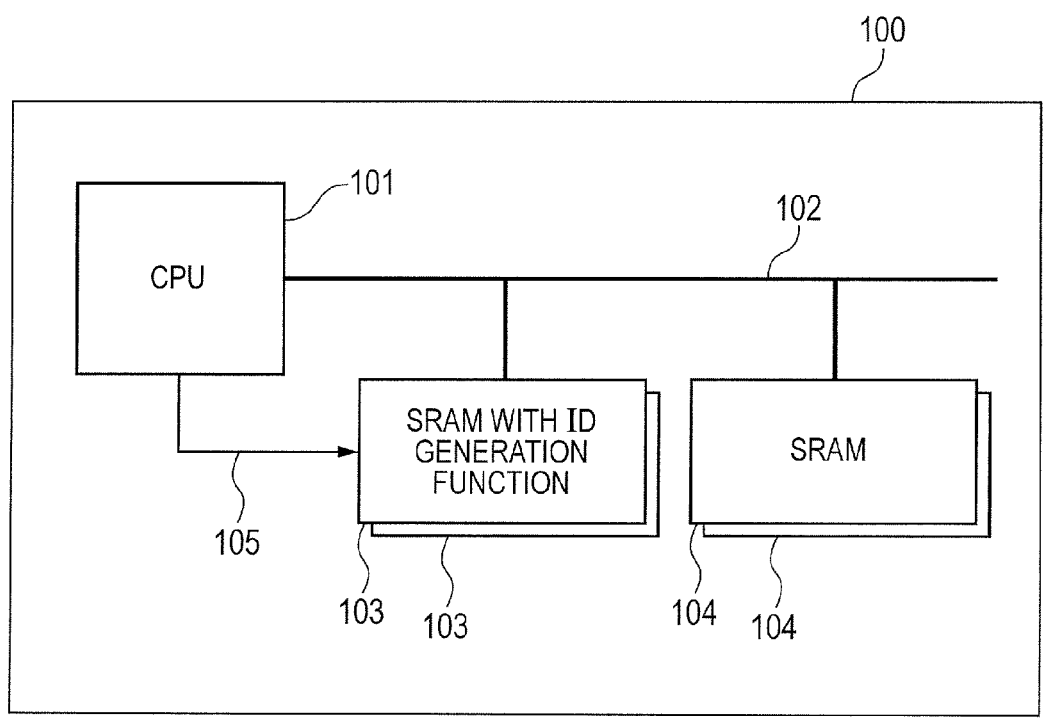
FIG. 1 is a block diagram showing the configuration of a semiconductor integrated circuit device according to embodiments.

Hereinafter, embodiments of the present invention will be described in detail with reference to the drawings. In all the drawings for illustrating the embodiments, the same sections are basically denoted by the same reference numerals, and their description will not be repeated.

First, the configuration of a semiconductor integrated circuit device according to the embodiments will be described with reference to FIG. 1. FIG. 1 is a block diagram showing the configuration of the semiconductor integrated circuit device. In FIG. 1, reference numeral 100 denotes a semiconductor chip sealed in the semiconductor integrated circuit device. In the manufacture of the semiconductor integrated circuit device, a plurality of semiconductor chips are formed in a semiconductor wafer through a plurality of manufacturing processes. FIG. 1 shows the semiconductor chip formed through a plurality of manufacturing processes. In semiconductor manufacturing processes, there occur variations in characteristics of elements such as MOSFETs and/or wiring lines among a plurality of semiconductor chips formed even in the same semiconductor wafer due to variations in manufacturing conditions in manufacturing processes. As a matter of course, in the case of different semiconductor wafers, there occur variations in characteristics of elements (including elements such as MOSFETs and wiring lines) among semiconductor chips formed in the semiconductor wafers. Although not restricted, the semiconductor integrated circuit device is completed by sealing the semiconductor chip formed through the manufacturing processes into a package.

Various circuit blocks are formed in the semiconductor chip 100. In the embodiments, there are shown a microprocessor (CPU) 101 and memory circuits 103 and 104 coupled to the CPU 101 via a bus 102 among the various circuit blocks. In the embodiments, the memory circuits 103 and 104 are comprised of SRAMs.

The CPU 101 fetches a program via the bus 102, and performs predetermined processing in accordance with the fetched program. In the predetermined processing, for example the CPU 101 reads data from the memory circuit via the bus 102, or supplies data to the memory circuit or the like via the bus 102. The program fetched by the CPU 101 may be read from the SRAM 103, 104 or may be read from another memory circuit (not shown). When the CPU 101 performs the processing in accordance with the program, the data read to the CPU 101 via the bus 102 may be outputted from either the memory 103 or 104, or may be outputted from another memory circuit or the like (not shown). Similarly, when the CPU 101 performs processing, the data outputted from the CPU 101 via the bus 102 might be supplied to either the memory circuit 103 or 104, or might be supplied to another circuit block (not shown).

In FIG. 1, the SRAMs 103 and 104 have similar configurations. However, unlike the SRAM 104, the SRAM 103 has an additional function of generating an ID (unique ID) unique to the semiconductor chip 100. When the CPU 101 supplies to the SRAM 103 a unique ID generation instruction signal (IDgen) 105 for generating an ID unique to the semiconductor chip 100, the SRAM 103 generates the unique ID. The unique ID generated by the SRAM 103 is held in the SRAM 103. The CPU 101 reads the held unique ID from the SRAM 103 via the bus 102, and uses it for security. For example, the CPU 101 uses the read unique ID to generate a secret key. The CPU 101 also can be regarded as configuring a control circuit, considering that the CPU 101 controls the generation of the unique ID when the SRAM generates the unique ID.

Hereinafter, the embodiments regarding the configurations of the SRAM 103 (memory circuit) with the ID generation function will be described.

In the example of FIG. 1, two SRAMs 103 with the ID generation function are provided. Thus, the use of multiple SRAMs 103 with the ID generation function makes it possible to easily generate multiple unique IDs. However, the invention is not limited to the multiple SRAMs, and is also applicable to a single SRAM 103 with the ID generation function.

First Embodiment

Figure 2:
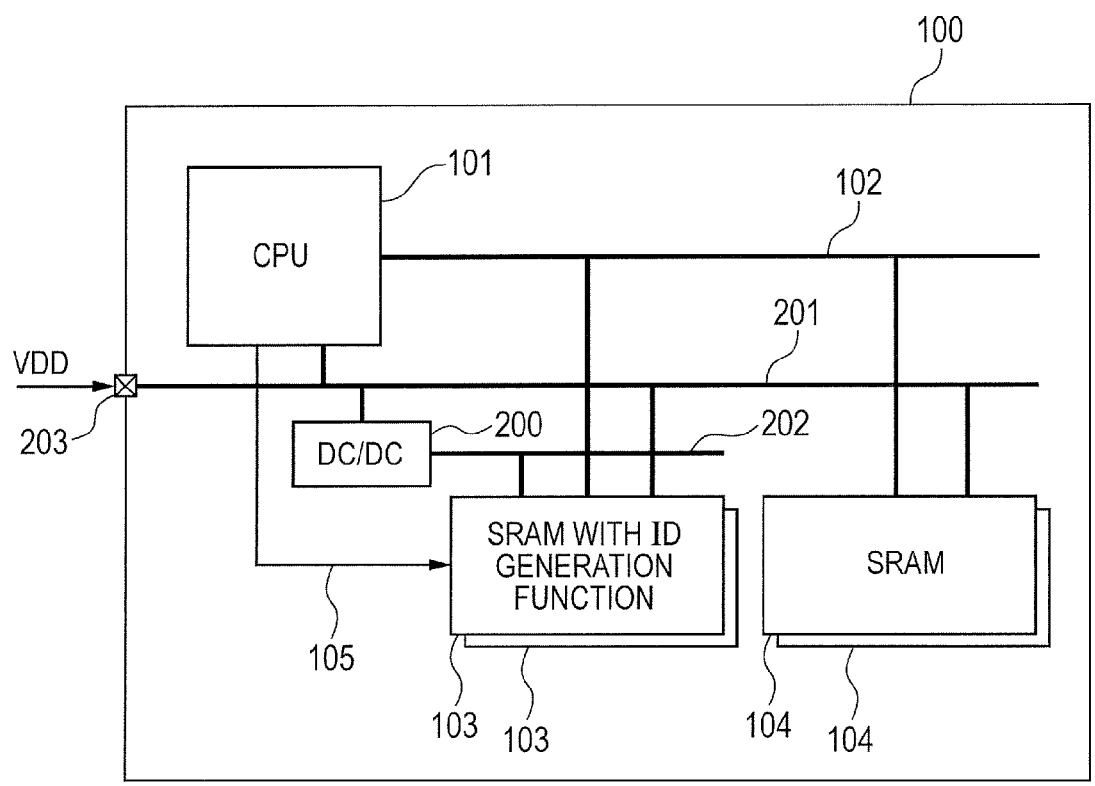
FIG. 2 is a block diagram showing the configuration of a semiconductor integrated circuit device according to a first embodiment.

FIG. 2 is a block diagram showing the configuration of a semiconductor integrated circuit device according to the first embodiment. In FIG. 2, the same sections as in FIG. 1 are denoted by the same reference numerals. In FIG. 2, reference numeral 200 denotes a booster circuit (voltage generation circuit), and reference numeral 202 denotes a voltage wiring line to which a voltage boosted by the booster circuit 200 is supplied. Further, in FIG. 2, reference numeral 203 denotes a power supply voltage terminal provided in the semiconductor chip 100, and reference numeral 201 denotes a power supply voltage wiring line for supplying a power supply voltage VDD supplied to the power supply voltage terminal to each circuit block formed in the semiconductor chip 100. In FIG. 2, the power supply voltage wiring line 201 is coupled to the CPU 101, the SRAMs 103, 104, and the booster circuit 200. Although not shown in FIG. 2, a ground voltage GND is supplied via a ground voltage wiring line to circuit blocks (including the CPU 101, the SRAMs 103, 104, and the booster circuit 200) in the semiconductor chip 100. The CPU 101, the SRAMs 103, 104, and the booster circuit 200 operate with the potential difference (VDD-GND) between the power supply voltage wiring line 201 and the ground voltage wiring line (not shown) as a power supply voltage.

In this embodiment, the power supply voltage VDD is boosted by the booster circuit 200, and the boosted voltage is supplied via the voltage wiring line 202 to the SRAM 103 with the ID generation function, of the SRAMs 103 and 104. Next, description will be made with reference to FIG. 3 and FIGS. 4A and 4B. Upon receiving the unique ID generation instruction signal 105, the SRAM 103 with the ID generation function generates the unique ID, using the voltage boosted by the booster circuit 200, and holds the ID.

Figure 3:
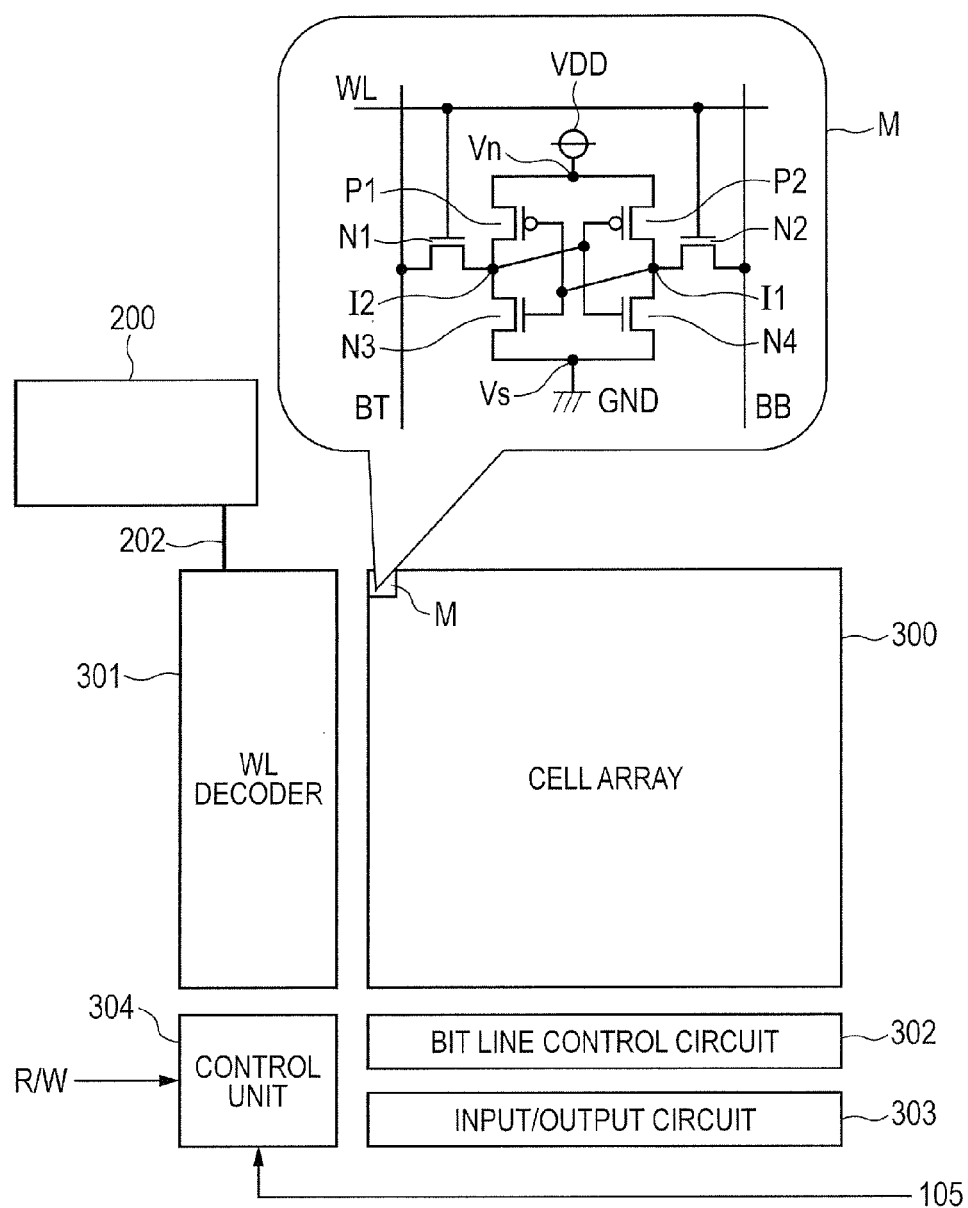
FIG. 3 is a block diagram showing the configuration of an SRAM according to the first embodiment.

FIG. 3 is a block diagram showing the configuration of the SRAM 103 with the ID generation function shown in FIG. 2. In FIG. 3, reference numeral 300 denotes a cell array (memory array); 301, a word line decoder (WL decoder); 302, a bit line control circuit; 303, an input/output circuit; and 304, a control unit.

The cell array has a plurality of memory cells M arranged in a matrix. Word lines are arranged in respective rows of the matrix, and each of the word lines is coupled to a plurality of memory cells M arranged in the row. Further, bit line pairs are arranged in respective columns of the matrix, and each of the bit line pairs is coupled to a plurality of memory cells M arranged in the column.

A plurality of address signals are supplied to the SRAM 103 with the ID generation function via the bus 102. One of the address signals is a row address signal which is supplied to the word line decoder 301, and one of the address signals is a column address signal which is supplied to the bit line control circuit 302. The word line decoder 301 decodes the supplied row address signal, and selects one word line according to the row address signal from among a plurality of word lines (not shown). On the other hand, the bit line control circuit 302 decodes the column address signal, and selects one or more bit line pairs according to the column address signal from among a plurality of bit line pairs. That is, the word line decoder 301 can be regarded as a row selection circuit, and the bit line control circuit 302 can be regarded as a column selection circuit.

The thus selected one or more bit line pairs are coupled to the bus 102 via the input/output circuit 303.

One word line is selected by the word line decoder 301, so that a plurality of memory cells M (in the one row) coupled to the word line are selected, and one or more bit line pairs are selected by the bit line control circuit 302. Thereby, one or more memory cells M arranged at the points of intersection of the selected one word line with the one or more bit line pairs are selected from the memory array 300.

The control unit 304 receives an instruction for a read operation and a write operation as a read/write instruction signal R/W from the CPU 101 (in FIG. 1). Further, the control unit 304 receives the unique ID generation instruction signal 105. If the read/write instruction signal R/W from the CPU 101 specifies the read operation, the control unit 304 instructs the word line decoder 301 to apply the power supply voltage VDD to the word line specified by the row address signal. Further, at this time, the control unit 304 instructs the input/output circuit 303 to output data on the selected one or more bit line pairs to the bus 102. Thereby, the data held in the selected one or more memory cells is read to the CPU 101 via the bus 102.

On the other hand, if the read/write instruction signal R/W from the CPU 101 specifies the write operation, the control unit 304 instructs the word line decoder 301 to apply the power supply voltage VDD to the word line specified by the row address signal. Further, at this time, the control unit 304 instructs the input/output circuit 303 to transfer (input) data on the bus 102 to the selected one or more bit line pairs. Thereby, the data from the CPU 101 via the bus 102 is transferred and written to the selected one or more memory cells.

In the first embodiment, when the unique ID generation instruction signal 105 is supplied to the control unit 304, the control unit 304 instructs the word line decoder 301 to apply the boosted voltage generated by the booster circuit 200 to the word line specified by the row address signal. By this instruction, the word line decoder 301 applies the boosted voltage higher than the power supply voltage VDD to the selected word line, and lowers the potential of the word line to a potential lower than the power supply voltage VDD after a lapse of a predetermined time. At this time, the control unit 304 instructs the input/output circuit 303 to apply a voltage equivalent to the power supply voltage VDD to the selected one or more bit line pairs. In response to this instruction, the input/output circuit 303 electrically separates the bit line control circuit 302 from the bus 102, and applies the voltage equivalent to the power supply voltage VDD to the selected one or more bit line pairs. In other words, the voltage equivalent to the power supply voltage VDD is applied to both the bit lines of the selected bit line pair.

Thus, when the unique ID generation instruction signal 105 is supplied to the control unit 304, the boosted voltage exceeding the power supply voltage VDD is supplied to the selected one or more memory cells via the word line. At this time, the voltage equivalent to the power supply voltage VDD is supplied to a pair of bit lines configuring the bit line pair. Further, the potential of the word line is lowered to the potential lower than the power supply voltage VDD after the lapse of the predetermined time.

The circuit of a typical one of the memory cells arranged in the cell array 300 is shown in the upper right of FIG. 3.

The memory cell includes P-channel MOS FETs (hereinafter referred to as P-MOSFETs) P1 and P2 and N-channel MOS FETs (hereinafter referred to as N-MOSFETs) N1 to N4. The source of the P-MOSFET P1 is coupled to the power supply voltage wiring line 201 to which the power supply voltage VDD is fed via a power supply voltage node Vn, and the source of the N-MOSFET N3 is coupled to the ground voltage wiring line to which the ground voltage GND is fed via a ground voltage node Vs. The drain of the P-MOSFET P1 and the drain of the N-MOSFET N3 are coupled in common to each other. Further, the gate of the P-MOSFET P1 and the gate of the N-MOSFET N3 are coupled in common to each other. Thereby, the P-MOSFET P1 and the N-MOSFET N3 configure a first inverter circuit which operates at the power supply voltage between the power supply voltage VDD and the ground voltage GND.

Similarly, the source of the P-MOSFET P2 is coupled to the power supply voltage wiring line 201 to which the power supply voltage VDD is fed, and the source of the N-MOSFET N4 is coupled to the ground voltage wiring line to which the ground voltage GND is fed. The drain of the P-MOSFET P2 and the drain of the N-MOSFET N4 are coupled in common to each other. Further, the gate of the P-MOSFET P2 and the gate of the N-MOSFET N4 are coupled in common to each other. Thereby, the P-MOSFET P2 and the N-MOSFET N4 configure a second inverter circuit which operates at the power supply voltage between the power supply voltage VDD and the ground voltage GND.

The gates of the P-MOSFET P1 and the N-MOSFET N3 as the input of the first inverter circuit are coupled to the drains of the P-MOSFET P2 and the N-MOSFET N4 as the output of the second inverter circuit. Similarly, the gates of the P-MOSFET P2 and the N-MOSFET N4 as the input of the second inverter circuit are coupled to the drains of the P-MOSFET P1 and the N-MOSFET N3 as the output of the first inverter circuit. That is, the first inverter circuit and the second inverter circuit configure the so-called latch circuit (holding circuit). In this case, the latch circuit is configured with the first and second inverter circuits, and therefore operates with the voltage difference (voltage) between the power supply voltage VDD and the ground voltage GND as the power supply voltage.

The input of the first inverter circuit is coupled via the N-MOSFET N2 to one bit line BB configuring the pair of bit lines, and the input of the second inverter circuit is coupled via the N-MOSFET N1 to the other bit line BT configuring the pair of bit lines. The gates of the N-MOSFETs N1 and N2 are coupled to the word line WL. The N-MOSFETs N1 and N2 function as MOSFETs for transferring data between the bit line pair and the latch circuit. The N-MOSFETs N1 and N2 have first input/output electrodes coupled to the bit lines and second input/output electrodes coupled to a pair of input/output nodes I2 and I1 of the latch circuit. The first and second input/output electrodes function as sources or drains, which are switched depending on voltage at operation and therefore written as merely the input/output electrodes here.

FIGS. 4A and 4B show operation waveforms for the above-described memory cell M selected by the row address signal and the column address signal. As shown in FIGS. 4A and 4B, in a period Tr, the voltage of the word line and the voltage of the bit line pair change when the read operation (mode) is specified by the read/write instruction signal R/W. Further, in a period Tw, the voltage of the word line and the voltage of the bit line pair change when the write operation (mode) is specified by the read/write instruction signal R/W. Further, in a period Ti, the voltage of the word line and the voltage of the bit line pair (BL pair) change when a unique ID generation operation (mode) is specified by the unique ID generation instruction signal 105.

When the read operation (Read) is specified, the potential of the selected word line WL is raised from the ground voltage GND to the power supply voltage VDD (selection voltage) as shown in FIG. 4A. The bit lines BB and BT configuring the bit line pair are precharged to a predetermined voltage before the read operation. When the voltage of the word line WL is changed to the power supply voltage VDD, the transfer MOSFETs N1 and N2 are brought into conduction. Thereby, the potential of one bit line or the other bit line configuring the bit line pair decreases from the precharged potential, in accordance with data held in the memory cell M.

For example, in the case where such data that turns on the N-MOSFET N4 and turns off the N-MOSFET N3 is held in the memory cell M, when the potential of the word line WL rises, electric charges accumulated beforehand in the bit line BB are discharged via the transfer MOSFET N2 and the N-MOSFET N4, so that the potential of the bit line BB decreases. At this time, the N-MOSFET N3 remains turned off, so that the potential of the bit line BT is maintained (FIG. 4B).

When the write operation (Write) is specified, the potential of the selected word line WL is raised from the ground voltage GND to the power supply voltage VDD (selection voltage) as shown in FIG. 4A. At this time, one bit line and the other bit line configuring the bit line pair are supplied with potentials according to data to be written from the CPU 101 via the bus 102 and the input/output circuit 303. That is, the bit line pair is supplied with complementary voltages.

For example, the voltage equivalent to the power supply voltage VDD is supplied to one bit line BB configuring the bit line pair, and the voltage equivalent to the ground voltage GND is supplied to the other bit line BT (FIG. 4B). When the potential of the word line WL rises to the power supply voltage VDD, the transfer MOSFETs N1 and N2 turn on. Thereby, the voltage equivalent to the power supply voltage VDD is applied to the gates of the P-MOSFET P1 and the N-MOSFET N3 configuring the first inverter circuit. On the other hand, the voltage equivalent to the ground voltage GND is applied to the gates of the P-MOSFET P2 and the N-MOSFET N4 configuring the second inverter circuit. Since the first inverter circuit and the second inverter circuit configure the latch circuit which exerts positive feedback, the N-MOSFET N4 configuring the second inverter circuit turns off, and the N-MOSFET N3 configuring the first inverter circuit turns on.

Thus, the N-MOSFET N4 or N3 turns on (off) in accordance with data to be written, and the data is written. After the data is written, the voltage of the selected word line WL rises to the power supply voltage VDD is lowered from the power supply voltage VDD to the ground voltage GND. Thereby, the transfer MOSFETs N1 and N2 turn off, so that the state (stable state) of the latch circuit is maintained. In other words, the data written to the memory cell M is held.

Next, the unique ID generation operation will be described. When the unique ID generation operation is specified; in response to the unique ID generation instruction signal 105, the control unit 304 instructs the word line decoder 301 to apply the boosted voltage generated by the booster circuit 200 to the selected word line WL. Thereby, the word line decoder 301 applies the voltage exceeding the power supply voltage VDD to the selected word line WL. At this time, the control unit 304 instructs the input/output circuit 303 to supply the voltage equivalent to the power supply voltage VDD to the selected bit lines. Thereby, the input/output circuit 303 supplies the voltage equivalent to the power supply voltage VDD to both the bit lines BB and BT configuring the bit line pair, as shown in FIG. 4B. After raising the voltage of the word line WL to the voltage exceeding the power supply voltage VDD, the word line decoder 301 lowers the voltage at time t1 after the lapse of the predetermined time.

By raising the voltage of the word line WL to the voltage higher than the power supply voltage VDD, voltage losses caused by the threshold voltages of the transfer MOSFETs N1 and N2 are reduced and voltages are transferred between the input/output nodes I1, I2 of the latch circuit included in the memory cell and the bit lines BB, BT. That is, the same voltage (equivalent to the power supply voltage VDD) is applied to the inputs of the first inverter circuit and the second inverter circuit configuring the latch circuit. By positive feedback formed by the first inverter circuit and the second inverter circuit, the potential of the inputs (the input/output nodes I1, I2 of the latch circuit) of the first inverter circuit and the second inverter circuit becomes an intermediate potential between the power supply voltage VDD and the ground voltage GND. In other words, the latch circuit configured with the first inverter circuit and the second inverter circuit goes into an undefined state.

When the potential of the word line WL falls and the transfer MOSFETs N1 and N2 turn off at time t1, voltages at the input/output nodes I1, I2 of the latch circuit change according to characteristics of the P-MOSFETs P1, P2 and the N-MOSFETs N3, N4. For example, in the case where a characteristic of the N-MOSFET N4, e.g., a threshold voltage thereof is lower than that of the N-MOSFET N3, the voltage at the input/output node I1 falls earlier than the voltage at the input/output node I2. The potential difference between the input/output nodes I1 and I2 is amplified by positive feedback. This amplification brings about a stable state where the N-MOSFET N4 is turned on and the N-MOSFET N3 is turned off. The difference in characteristics between these MOSFETs is caused, for example, by variations during manufacturing. Consequently, when the voltage of the word line WL is lowered and the transfer MOSFETs N1 and N2 are turned off, the memory cell holds data according to characteristic variations of elements such as MOSFETs.

Thereby, it is possible to generate the unique ID, based on characteristic variations of elements or the like during manufacturing. The generated unique ID, which is held in the memory cell M, is read by the CPU 101 and thus can be used as an authentication key. In this case, for example, each of the memory cells coupled to one word line WL may generate the unique ID as described above, or one memory cell may generate the unique ID.

According to the first embodiment, in response to the unique ID generation instruction signal, the voltage of the word line of the memory cell is raised to the voltage that is higher than the power supply voltage VDD of the memory cell in terms of an absolute value, and the voltage equivalent to the power supply voltage VDD is supplied to the memory cell via the bit line pair. This makes it possible to reduce the loss of the voltage transferred from the bit line pair to the latch circuit configuring the memory cell and bring the memory cell to the undefined state with reliability. Further, by lowering the voltage of the word line to the value that is smaller than the power supply voltage VDD of the memory cell in terms of an absolute value, the data (unique ID) according to the characteristics of the MOSFETs configuring the memory cell is generated and held in the memory cell.

A booster circuit that is formed in the same semiconductor chip 100 and supplies a boosted voltage to other circuit blocks may be used as the booster circuit 200. For example, in the above-mentioned write assist, the relatively high voltage is used and a voltage generation circuit for generating this voltage is provided in the semiconductor chip. This voltage generation circuit may be also used as the booster circuit 200.

Thus, according to this embodiment, it is possible to generate the unique ID with the suppression of overhead.

Second Embodiment

Figure 5:
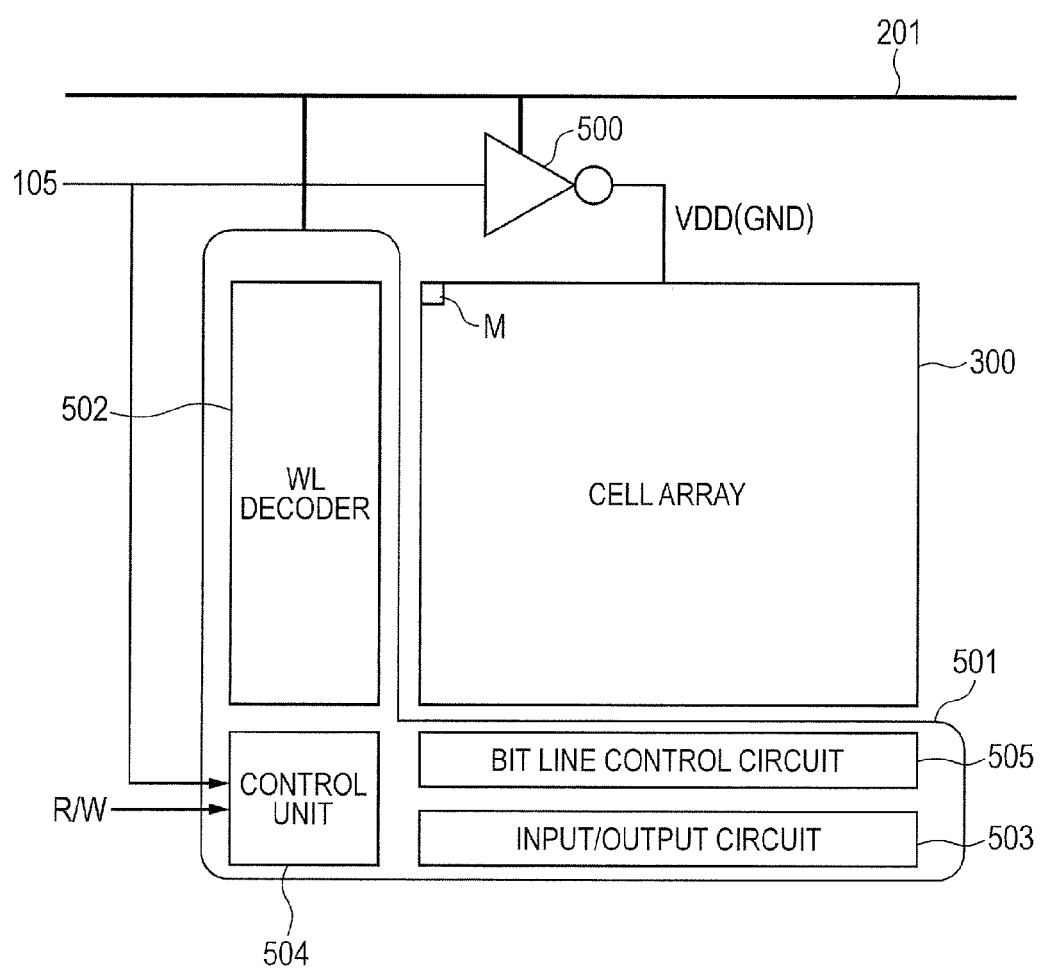
FIG. 5 is a block diagram showing the configuration of an SRAM according to a second embodiment.

FIG. 5 is a block diagram showing the configuration of an SRAM according to the second embodiment. The configuration of the SRAM shown in FIG. 5 is similar to that of the SRAM shown in FIGS. 2 and 3. In FIG. 5, the same sections as in FIGS. 2 and 3 are denoted by the same reference numerals, and the differences will be mainly described.

The cell array 300 includes a plurality of memory cells M arranged in a matrix, as described with FIG. 3. In the second embodiment, the feed of the power supply voltage VDD and/or the ground voltage GND to the memory cells M is controlled by the unique ID generation instruction signal 105.

In FIG. 5, a cell power supply control circuit (voltage control circuit) 500 receives the unique ID generation instruction signal 105 and controls the feed of the power supply voltage VDD (ground voltage GND) to the cell array 300. In the second embodiment, the cell power supply control circuit 500 is comprised of an inverter circuit which is coupled between the power supply voltage wiring line 201 and the ground voltage wiring line (not shown) and operates with the voltage difference between the power supply voltage VDD and the ground voltage GND as the power supply voltage. The unique ID generation instruction signal 105 is supplied to the input of the inverter circuit. The output of the inverter circuit, that is, the output of the cell power supply control circuit 500 is coupled to the power supply nodes of the memory cells M included in the cell array 300. Although described with reference to FIGS. 6 and 8 later, the power supply node is a node where the memory cell M receives the power supply voltage or the ground voltage as the operating voltage.

In FIG. 5, a peripheral circuit 501 of the cell array 300 includes a word line decoder (WL decoder) 502, a bit line control circuit 505, an input/output circuit 503, and a control unit 504. The peripheral circuit 501 is coupled between the power supply voltage wiring line 201 and the ground voltage wiring line (not shown) to which the power supply voltage VDD and the ground voltage GND are fed. Each circuit block (the word line decoder 502, the bit line control circuit 505, the input/output circuit 503, the control unit 504, etc.) included in the peripheral circuit 501 operates with the voltage difference between the power supply voltage VDD and the ground voltage GND as the power supply voltage.

The control unit 504, the word line decoder 502, the bit line control circuit 505, and the input/output circuit 503 shown in FIG. 5 are similar to the control unit 304, the word line decoder 301, the bit line control circuit 302, and the input/output circuit 303 described with FIG. 3, and the differences will be described.

The control unit 504 receives the read/write instruction signal R/W and the unique ID generation instruction signal 105, and operates differently from the control unit 304 described with FIG. 3 when the generation of the unique ID is specified by the unique ID generation instruction signal 105. That is, when the generation of the unique ID is specified; in response thereto, the control unit 504 instructs the word line decoder to apply the ground voltage of the circuit to the selected word line. Further, when the generation of the unique ID is specified, the control unit 504 instructs the bit line control circuit 505 and the input/output circuit 503 to maintain the bit line pairs in a precharge state.

In the read operation and the write operation, the word line decoder 502 supplies the voltage equivalent to the power supply voltage VDD to the selected word line, like the word line decoder 301 described with FIG. 3. On the other hand, in the generation of the unique ID, the word line decoder 502 applies the voltage equivalent to the ground voltage GND to the word line selected by the row address signal, in accordance with an instruction from the control unit 504. Similarly, in the read operation and the write operation, the bit line control circuit 505 and the input/output circuit 503 operate similarly to the bit line control circuit 302 and the input/output circuit 303 described with FIG. 3. However, when the generation of the unique ID is specified, the bit line control circuit 505 and the input/output circuit 503 maintain the bit line pairs in the precharge state.

The unique ID generation instruction signal 105 is changed from a low level to a high level at the time of specifying the generation of the unique ID. When the unique ID generation instruction signal 105 changes to the high level, the cell power supply control circuit (inverter circuit) 500 changes the power supply voltage fed to the memory cell M from the power supply voltage VDD to the ground voltage GND. Thereby, the feed of the power supply voltage VDD to the memory cell M stops, which disables the memory cell M from holding information. The feed to the memory cell M is resumed after a lapse of a predetermined time from the stop of the feed. When the feed is resumed and the power supply voltage VDD is supplied to the memory cell M, the state of the latch circuit included in the memory cell M is determined in accordance with characteristics of elements (such as MOSFETs) configuring the memory cell M. Thereby, data according to variations during manufacturing is generated and stored in the memory cell M, thus generating the unique ID.

The feed is resumed, for example, by changing the unique ID generation instruction signal 105 to the low level after the lapse of the predetermined time from the change to the high level. The thus changing unique ID generation instruction signal 105 is generated by the CPU 101 (in FIG. 1) as the control circuit. To generate the unique ID, it is possible to use one or more memory cells in the cell array 300. The unique ID thus generated and stored in the memory cell M is read from the SRAM 103 (in FIG. 1) by the CPU 101 when used.

When the feed to the cell array 300 is stopped, the feed to the peripheral circuit 501 may also be stopped. This makes it possible to reduce power consumption. However, in this embodiment, the feed to the peripheral circuit 501 is separated from the feed to the cell array 300. Thereby, the power supply voltage is fed to the peripheral circuit 501 even during a period when the feed of the power supply voltage VDD to the cell array 300 is stopped. With this, when the feed to the cell array 300 is resumed, it is possible to prevent a change in the potential of the signal (e.g., the signal of the word line) supplied from the peripheral circuit 501 to the cell array 300 and accordingly prevent undesired data from being written to the memory cell M in the cell array 300.

Figure 6:
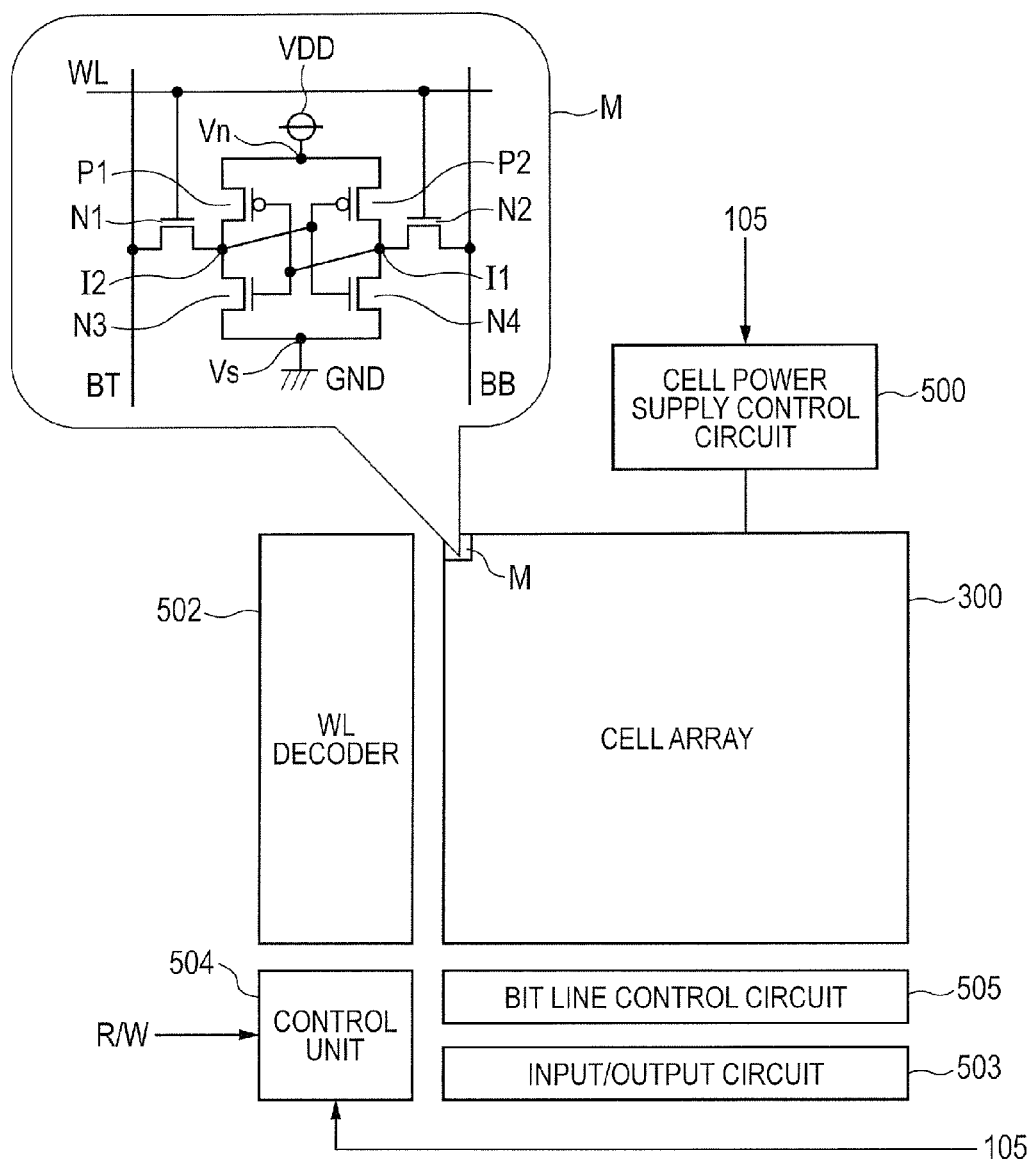
FIG. 6 is a block diagram showing the configuration of the SRAM according to the second embodiment.

FIG. 6 is a detailed diagram of the circuit of the memory cell M in the SRAM described with reference to FIG. 5. In FIG. 6 as well, the same sections as in FIG. 5 are denoted by the same reference numerals, and description thereof is omitted. In FIG. 6, the power supply voltage wiring line 201 shown in FIG. 5 is not shown. Further, instead of the inverter circuit, a block 500 is shown as the cell power supply control circuit.

In the upper left of FIG. 6, the circuit of the memory cell M is shown by way of typical example. The circuit of the memory cell M has the same configuration as that of FIG. 3, and the same sections in the circuit of the memory cell as in FIG. 3 are denoted by the same reference numerals. The sources of the P-MOSFETs P1 and P2 configuring the memory cell M are coupled to the power supply voltage node Vn, and the sources of the N-MOSFETs N3 and N4 are coupled to the ground voltage node Vs. The voltage difference between the power supply voltage VDD and the ground voltage GND is applied between the power supply voltage node Vn and the ground voltage node Vs, thereby operating the latch circuit configuring the memory cell.

FIGS. 7A to 7C are waveform diagrams showing the operation of the SRAM shown in FIG. 6. The operation will be described based on the waveform diagrams. As in FIGS. 4A and 4B, FIG. 7A shows the voltage waveform of the selected word line, and FIG. 7B shows the voltage waveform of the selected bit line pair BL. FIG. 7C shows the waveform of the power supply voltage of the cell array 300. In other words, FIG. 7C shows the voltage waveform of the power supply voltage node Vn of the memory cell M.

In FIGS. 7A to 7C, Tr is the period of the read operation (Read), Tw is the period of the write operation (Write), and Ti is the period of the unique ID generation operation (ID generation). In FIG. 7C, during the period Tr of the read operation and the period Tw of the write operation, the cell power supply (power supply to the cell array 300) is at the power supply voltage VDD because the unique ID generation instruction signal 105 (in FIG. 5) is at the low level. Therefore, the read operation and the write operation during the read period Tr and the write period Tw are the same as described with FIG. 4, and will not be described again.

In the period Ti of the unique ID generation operation, the unique ID generation instruction signal 105 is changed from the low level to the high level by the CPU 101. The unique ID generation instruction signal 105 is changed to the low level by the CPU 101, for example, at time t1 after the lapse of the predetermined time from the change to the high level. When the unique ID generation instruction signal 105 is changed from the low level to the high level, the cell power supply control circuit 500 comprised of the inverter circuit changes the voltage fed to the cell array 300 to the ground voltage GND as shown in FIG. 7C. Further, when the unique ID generation instruction signal 105 is changed from the high level to the low level at time t1, the cell power supply control circuit 500 changes the voltage fed to the cell array 300 to the power supply voltage VDD again.

The power supply voltage of the cell array 300, that is, the voltage at the power supply voltage node Vn of the memory cell M changes to the ground voltage GND when the unique ID generation instruction signal 105 changes to the high level. This decreases the potential difference between the power supply voltage node Vn of the memory cell M and the ground voltage node Vs. As a result, the latch circuit in the memory cell configured with the P-MOSFETs P1, P2 and the N-MOSFETs N3, N4 cannot hold data. That is, the data held in the memory cell is corrupted (undefined state). After the data is corrupted, that is, at time t1, the unique ID generation instruction signal 105 is changed to the low level again. Thereby, the power supply voltage VDD is supplied to the power supply voltage node Vn of the memory cell M, which increases the potential difference between the power supply voltage node Vn and the ground voltage node Vs, so that the latch circuit starts to operate.

When the latch circuit starts to operate, voltages at the input/output nodes I1, I2 of the latch circuit change according to characteristics of elements such as the P-MOSFETs P1, P2 and the N-MOSFETs N3, N4. The characteristics of these MOSFETs are determined in accordance with variations during the manufacture of the semiconductor chip. Accordingly, the voltages at the input/output nodes I1, I2 of the latch circuit are also determined in accordance with the manufacturing variations. The latch circuit performs positive feedback which increases the potential difference between the input/output nodes I1 and I2. As a result, the latch circuit in the memory cell M holds data according to the manufacturing variations.

Thus, the unique ID data is stored in the memory cell M. In the second embodiment, during the ID generation period Ti, the voltage of the word line WL is lowered to the ground voltage GND as shown in FIG. 7A. This prevents the transfer MOSFETs N1 and N2 in the memory cell M from turning on during the ID generation period. If the transfer MOSFETs in the memory cell M turn on during the ID generation period, it can be considered that voltages of the bit line pair BL are transferred to the input/output nodes I1 and I2 via the transfer MOSFETs and the latch circuit in the memory cell M holds data according to the voltages of the bit line pair BL. To thus control the voltage of the word line WL, as described with FIG. 5, the power supply voltage continues to be fed to the peripheral circuit 501 via the power supply voltage wiring line 201 even when the power supply to the cell array 300 is shut off.

Figure 8:
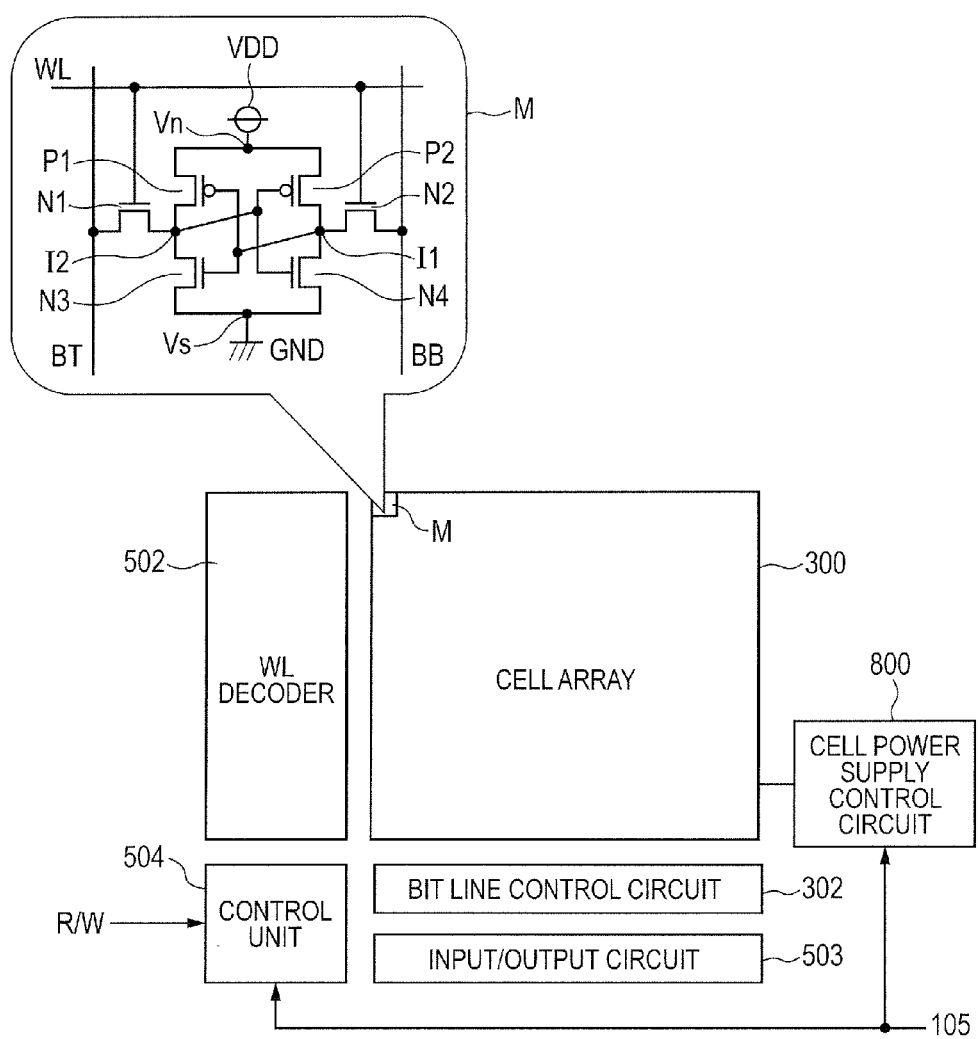
FIG. 8 is a block diagram showing the configuration of an SRAM according to the second embodiment.

FIG. 8 shows a modification of the SRAM shown in FIG. 6. In FIG. 8 as well, the same sections as in FIG. 6 are denoted by the same reference numerals. Therefore, the differences from FIG. 6 will be mainly described.

In the SRAM shown in FIG. 8, a cell power supply control circuit (voltage control circuit) 800 for controlling the ground voltage GND of the cell array 300 is provided instead of the cell power supply control circuit 500 shown in FIG. 6. The cell power supply control circuit 800 controls the ground voltage of the memory cell M provided in the cell array 300. That is, the cell power supply control circuit 800 controls a voltage applied to the ground voltage node Vs of the memory cell M, in accordance with the unique ID generation instruction signal 105.

Although not restricted, the cell power supply control circuit 800 includes two inverter circuits (not shown) which operate at the voltage between the power supply voltage VDD and the ground voltage GND. The unique ID generation instruction signal 105 is inputted to a first inverter circuit of the two inverter circuits, and the first inverter circuit inverts the unique ID generation instruction signal 105 and outputs the inverted signal. The output of the first inverter circuit is inputted to a second inverter circuit, and the output of the second inverter circuit is the ground voltage of the cell array 300. That is, the unique ID generation instruction signal 105 is buffered by the cell power supply control circuit 800 and fed to the cell array 300 as the ground voltage GND. With this, when the unique ID generation instruction signal 105 is set to the high level which instructs the generation of the unique ID, the ground voltage GND of the cell array 300 changes to the power supply voltage VDD.

Figure 9:
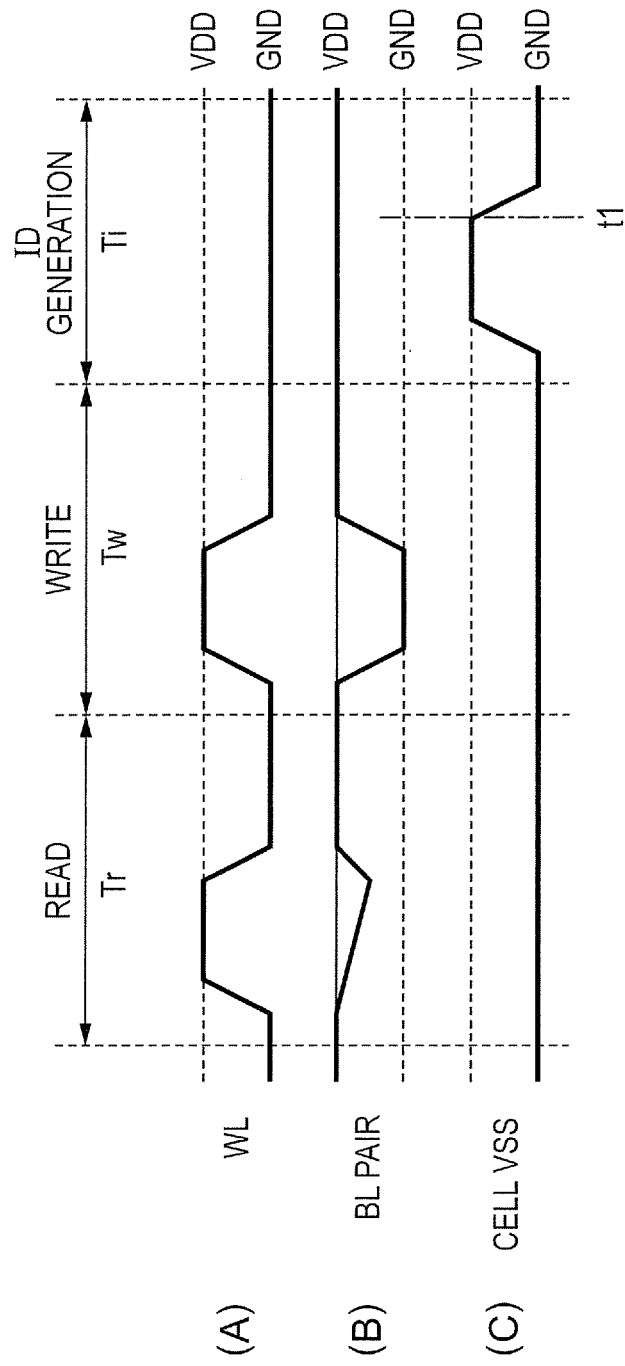
FIGS. 9A to 9C are waveform diagrams showing the operation of the SRAM according to the second embodiment.

FIGS. 9A to 9C are waveform diagrams showing the operation of the SRAM of FIG. 8. FIGS. 9A to 9C are similar to FIGS. 7A to 7C, and therefore the differences will be mainly described.

Figure 7:
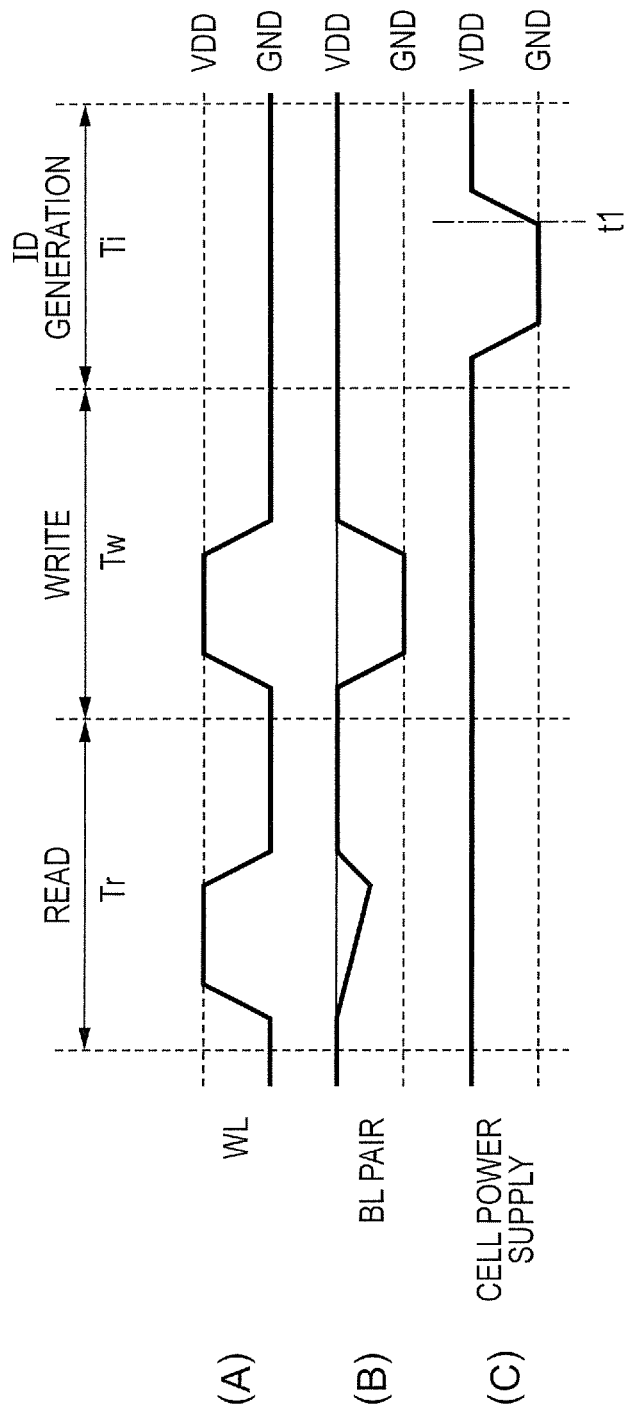
FIGS. 7A to 7C are waveform diagrams showing the operation of the SRAM according to the second embodiment.

Unlike FIG. 7C, FIG. 9C shows a change in the ground voltage (cell VSS) of the cell array 300. During the period Tr of the read operation (Read) and the period Tw of the write operation (Write), the unique ID generation instruction signal 105 is at the low level; accordingly, the ground voltage GND is fed to the cell array 300. That is, the ground voltage GND is supplied to the ground voltage node Vs of the memory cell M from the cell power supply control circuit 800. Thereby, the read operation and the write operation are operated as in FIG. 7.

In the period Ti of the unique ID generation operation (ID generation), as described with FIG. 7, the unique ID generation instruction signal 105 changes from the low level to the high level, and changes to the low level again at time t1 after the lapse of the predetermined. The unique ID generation instruction signal 105 is buffered by the cell power supply control circuit 800 and fed to the cell array 300 as the ground voltage GND. Therefore, in the period Ti of the unique ID generation, the ground voltage of the cell array 300 changes from the ground voltage GND to the power supply voltage VDD, and changes to the ground voltage GND again at time t1 after the lapse of the predetermined.

As the ground voltage supplied to the cell array 300, that is, the voltage supplied to the ground voltage node Vs of the memory cell M approaches the power supply voltage VDD, the potential difference between the power supply voltage node Vn and the ground voltage node Vs decreases. Thereby, data in the latch circuit in the memory cell M is corrupted. When the potential of the ground voltage node Vs decreases again at time t1 after the lapse of the predetermined, the latch circuit holds data according to characteristics of the MOSFETs configuring the latch circuit. Thereby, as described with reference to FIGS. 6 and 7, the unique ID data according to variations during manufacturing is generated and stored in the memory cell M.

In this modification as well, the feed of the ground voltage to the peripheral circuit such as the word line decoder 502 is separated from the feed of the ground voltage to the cell array 300. Thereby, the ground voltage GND is supplied to the peripheral circuit even during the period Ti of the unique ID generation operation. Since the ground voltage GND is supplied to the word line decoder 502 even during the period Ti of the unique ID generation operation, the word line decoder 502 supplies the ground voltage GND to the word line WL during the period Ti. This can reduce the writing of undesired data to the memory cell M.

According to the second embodiment, the semiconductor integrated circuit device includes the voltage control circuit which generates the power supply voltage for operating the latch circuit in the memory cell. In response to the unique ID generation instruction, the power supply voltage control circuit changes the power supply voltage so as to decrease the voltage difference supplied to the latch circuit as the operating voltage, and then changes the power supply voltage so as to increase the voltage difference. Thereby, the latch circuit in the memory cell goes into the undefined state, and then the data (unique ID) according to the characteristics of elements such as the MOSFETs configuring the memory cell is generated and held.

According to this embodiment, it is possible to generate and hold the unique ID with the suppression of increase in overhead.

Third Embodiment

Figure 10A:
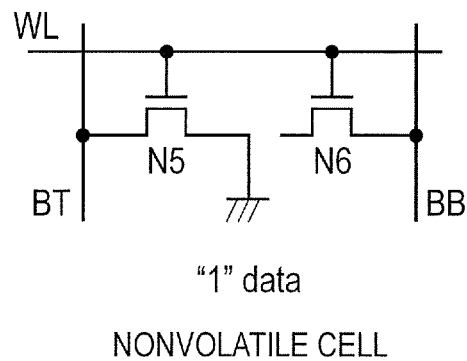
FIGS. 10A to 10C are circuit diagrams showing the configuration of a nonvolatile memory according to a third embodiment.
Figure 10B:
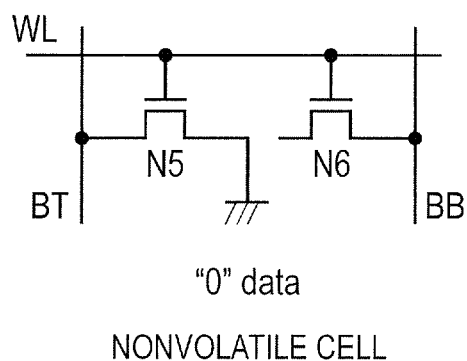
Figure 10C:
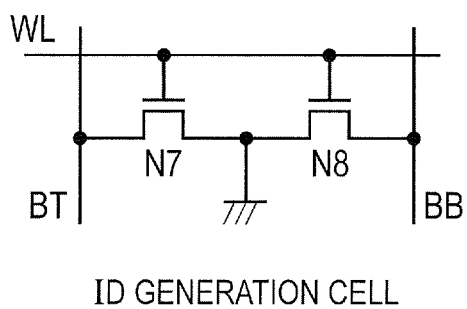

FIGS. 10A to 10C are circuit diagrams showing the configuration of a semiconductor integrated circuit device according to the third embodiment.

In the above embodiments, the SRAM incorporated in the semiconductor integrated circuit device has been described by way of example. In the third embodiment, an example of using the nonvolatile memory instead of the SRAM will be described. FIGS. 10A to 10C show the configuration of cells in the nonvolatile memory.

Although not restricted, the semiconductor integrated circuit device according to the third embodiment includes two kinds of nonvolatile memories. That is, the semiconductor integrated circuit device includes a nonvolatile memory for storing data beforehand and a nonvolatile memory for generating the unique ID. The nonvolatile memory for storing data beforehand is used, for example, instead of the SRAM 104 in FIG. 1, and the nonvolatile memory for generating the unique ID is used instead of the SRAM 103 with the ID generation function in FIG. 1.

The nonvolatile memory for storing data beforehand has a plurality of memory cells. FIGS. 10A and 10B show the configuration of the memory cells. The nonvolatile memory for generating the unique ID also has a plurality of memory cells, and FIG. 10C shows the configuration of one of the memory cells.

First, the configuration of the memory cell will be described with reference to FIGS. 10A and 10B. One memory cell (nonvolatile memory cell: written as nonvolatile cell in FIGS. 10A and 10B) has N-MOSFETs N5 and N6 whose gates are coupled to the word line WL. One electrode (source or drain) of one N-MOSFET N5 of the two N-MOSFETs N5 and N6 is coupled to one bit line BT of one bit line pair BL, and one electrode (source or drain) of the other N-MOSFET N6 is coupled to the other bit line BB. Either of the other electrodes (drain or source) of the N-MOSFETs N5 and N6 is coupled to the ground voltage GND, depending on data to be stored beforehand. The other electrode that is not coupled to the ground voltage GND is set in a floating state.

In FIG. 10A, the other electrode of the N-MOSFET N5 is coupled to the ground voltage GND, and the other electrode of the N-MOSFET N6 is set in the floating state. The thus coupled state is a state of storing data "1" for example. On the other hand, in FIG. 10B, the other electrode of the N-MOSFET N6 is coupled to the ground voltage GND, and the other electrode of the N-MOSFET N5 is set in the floating state. The thus coupled state is a state of storing data "0" for example. Thus, data is stored beforehand in the memory cell.

The memory cell is read by precharging the bit line pair BL and then raising the word line WL to the high level. That is, by raising the word line WL to the high level, electric charges precharged in the bit line are discharged via the MOSFET whose other electrode is coupled to the ground voltage GND, and the voltage of the one bit line of the bit line pair BL decreases. By detecting the decrease in voltage, the data stored beforehand is read.

FIG. 10C shows the configuration of the memory cell for generating the unique ID (nonvolatile memory cell: written as ID generation cell in FIG. 10C). The memory cell for generating the unique ID has N-MOSFETs N7 and N8 whose gates are coupled to the word line WL. One electrode (source or drain) of one N-MOSFET N7 is coupled to one bit line BT of the bit line pair BL, and one electrode (source or drain) of the N-MOSFET N 8 is coupled to the other bit line BB of the bit line pair BL. Further, the other electrodes (drain or source) of the N-MOSFETs N7 and N8 are coupled to the ground voltage GND.

In the memory cell for generating the unique ID shown in FIG. 10C, the bit line pair BL is precharged, and then the potential of the word line WL is raised to the high level. Thereby, electric charges precharged in the bit lines BB and BT are discharged via the N-MOSFETs N7 and N8, and the potentials of the bit lines BB and BT decrease. The rates of decreases in the potentials are determined in accordance with characteristics of the N-MOSFETs N7 and N8. Variations during the manufacture of the semiconductor chip cause a difference between the characteristics of the N-MOSFETs N7 and N8, which causes a potential difference between the bit lines BB and BT. In the third embodiment, this potential difference is detected and used as the unique ID. This makes it possible to generate the unique ID with the memory cell having the same configuration as the memory cell for storing data beforehand, which can facilitate the design.

While FIG. 10C illustrates one memory cell for generating the unique ID, a plurality of memory cells for generating the unique ID may be provided. Further, P-MOSFETs may be used as MOSFETs configuring the memory cell. Further, instead of precharging the bit line pair, currents may be constantly fed through the bit line pair. The potential difference between the bit lines may be amplified by a differential amplifier circuit or may be detected by a latch circuit using positive feedback.

The data and the unique ID stored in the nonvolatile memories are read by the CPU 101 via the bus 102 (in FIG. 1).

Further, the above-described nonvolatile memories may be provided besides the SRAMs 103 and 104 shown in FIG. 1, instead of substituting the nonvolatile memories for the SRAMs.

According to the third embodiment, it is possible to obtain the nonvolatile memory cell for generating the unique ID having the configuration similar to that of the nonvolatile memory cell for storing data beforehand, which can facilitate the design and prevent increase in overhead.

Fourth Embodiment

Figure 4:
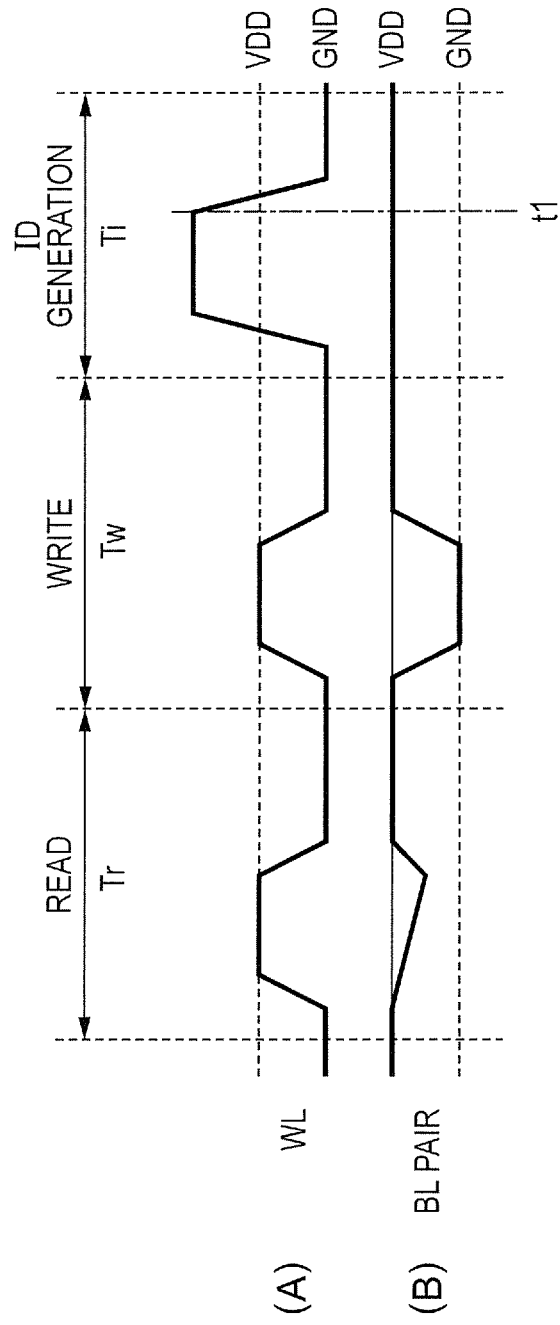
FIGS. 4A and 4B are waveform diagrams showing the operation of the SRAM according to the first embodiment.
Figure 11:
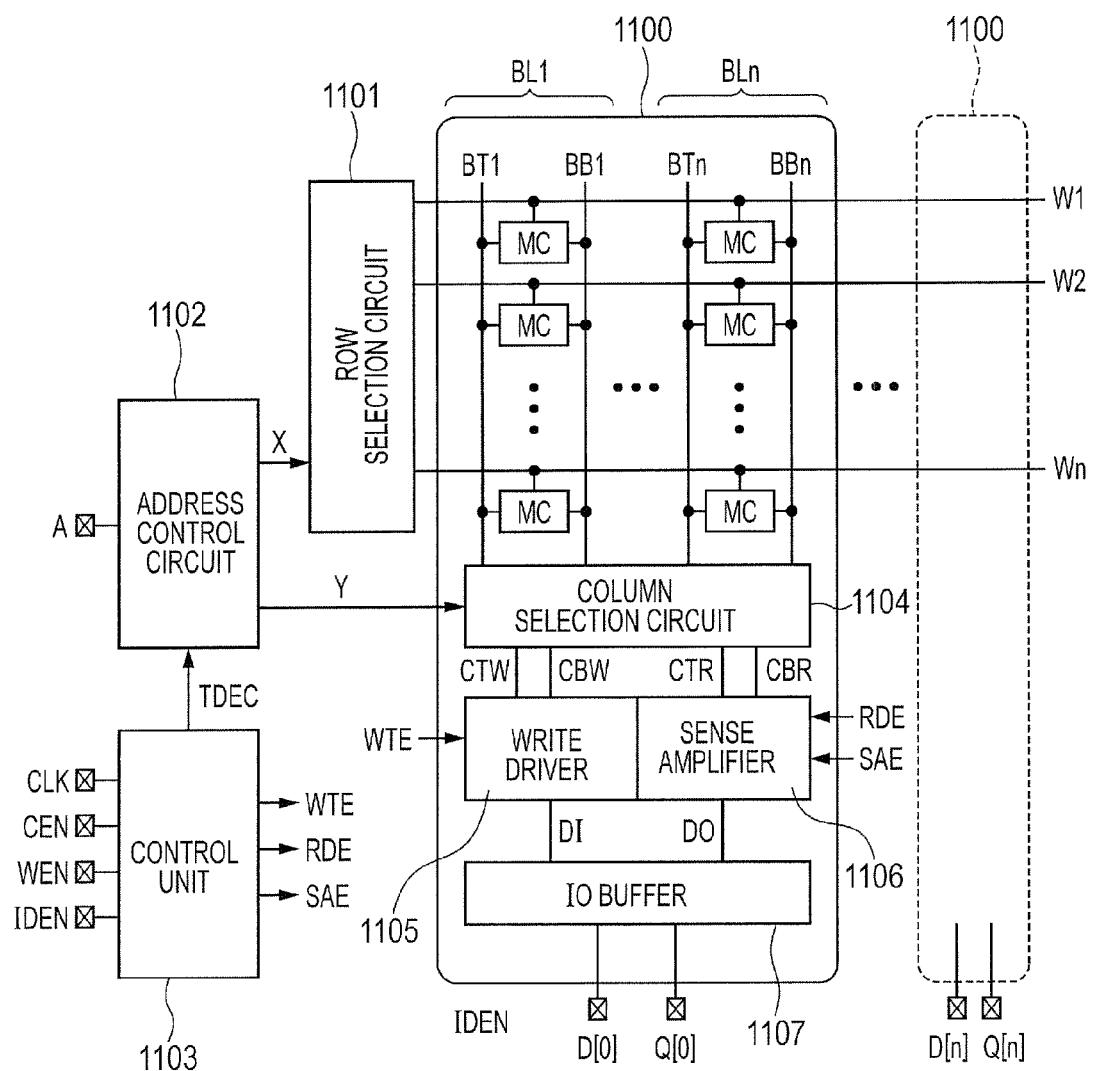
FIG. 11 is a block diagram showing the configuration of an SRAM according to a fourth embodiment.

FIG. 11 is a block diagram showing the configuration of an SRAM according to the fourth embodiment. The SRAM shown in FIG. 4 is formed in one semiconductor chip.

In the fourth embodiment, a cell array has a plurality of memory blocks 1100 with the same configuration. Therefore, the internal configuration of a typical one of the memory blocks is shown in FIG. 11. Although not restricted, data can be written and read on a bit-by-bit basis in each memory block. That is, multiple bits of data D[0] to D[n] or Q[0] to Q[n] can be written or read in parallel in terms of time.

Hereinafter, the typical memory block 1100 will be described, while it is to be understood that the remaining memory blocks have the same configuration.

The memory block 1100 has a plurality of memory cells MC arranged in a matrix. Word lines W1 to Wn are arranged in respective rows of the matrix, and memory cells MC arranged in each row are coupled to the word line arranged in the row. Further, bit line pairs BL1 to BLn are arranged in respective columns of the matrix, and memory cells MC arranged in each column are coupled to the bit line pair arranged in the column. The bit line pairs BL1 to BLn have a pair of bit lines BT1 and BB1 to a pair of bit lines BTn and BBn, respectively.

The memory cell MC has the same configuration as the memory cell M described with FIG. 3. That is, the memory cell MC includes the P-MOSFETs P1 and P2 and the N-MOSFETs N1 to N4 shown in FIG. 3. The gates of the transfer N-MOSFETs N1 and N2 of the N-MOSFETs N1 to N4 are coupled to the word line in the row where the memory cell is arranged. Further, electrodes of the transfer N-MOSFETs N1 and N2 are coupled to the bit line pair in the column where the memory cell is arranged. That is, an electrode of the transfer N-MOSFET N1 is coupled to one bit line BT of the bit line pair BL in the corresponding column, and an electrode of the transfer N-MOSFET N2 is coupled to the other bit line BB of the bit line pair BL in the corresponding column.

In FIG. 11, a row selection circuit 1101 including the word line decoder 301 described with FIG. 3 decodes a row address signal X supplied from an address control circuit 1102, and selects a word line specified by the row address signal X from among the word lines W1 to Wn. The address control circuit 1102 imports an address signal A, based on an address control signal TDEC from a control unit 1103, and separates the address signal A into the row address signal X and a column address signal Y. The separated row address signal X is supplied to the row selection circuit 1101 as described above, and the separated column address signal Y is supplied to a column selection circuit 1104. In FIG. 11, each of the address signal A, the row address signal X, and the column address signal Y is indicated by one signal line; however, each address signal is configured with a plurality of address signals.

The column selection circuit 1104 decodes the supplied column address signal, and selects a bit line pair specified by the column address signal from among the bit line pairs BL1 to BLn. The selected bit line pair is coupled to a common write bit line pair and a common read bit line pair. The common write bit line pair has a pair of common write bit lines CTW and CBW, and the common read bit line pair has a pair of common read bit lines CTR and CBR. Although not restricted, the bit line BT1 (BTn) of the selected bit line pair BL is coupled to the common write bit line CTW and the common read bit line CTR, and the bit line BB1 (BBn) is coupled to the common write bit line CBW and the common read bit line CBR.

The common write bit lines CTW and CBW are coupled to a write driver 1105. The write driver 1105 receives input data DI which is 1-bit data D[0] supplied via an input/output circuit (IO buffer) 1107 from an input terminal. If a write enable signal WTE specifies a write operation, the write driver 1105 supplies potentials according to the input data DI to the common write bit lines CTW and CBW. The potentials supplied to the common write bit lines CTW and CBW are complementary potentials. That is, for example, if the high-level voltage is supplied to the common write bit line CTW, the low-level voltage is supplied to the common write bit line CBW.

The common read bit lines CTR and CBR are coupled to a sense amplifier 1106. If a read enable signal RDE specifies a read operation and a sense amplifier activation signal SAE specifies the activation of the sense amplifier, the sense amplifier 1106 amplifies the potential difference between the common read bit lines CTR and CBR, and supplies output data DO to the input/output circuit 1107. The input/output circuit 1107 outputs 1-bit data Q[0] according to the supplied output data DO.

The voltages of the pair of bit lines of the selected bit line pair are complementary voltages in accordance with data stored in the selected memory cell. For example, if the voltage of the bit line BT1 configuring the bit line pair BL1 is at the high level in accordance with data stored in the selected memory cell, the voltage of the other bit line BB1 configuring the bit line pair BL1 is at the low level. Accordingly, the voltages of the common read bit lines CTR and CBR to which the selected bit line pair is coupled are complementary voltages.

The control unit 1103 receives a clock signal CLK, an output enable signal CEN, a write enable signal WEN, and a unique ID generation instruction signal IDEN, and, based on these signals, generates the control signals TDEC, WTE, RDE, SAE.

The word line and the bit line pair are selected based on the address signal A, and the memory cell coupled to the selected word line and bit line pair is selected from among a plurality of memory cells arranged in a matrix. For writing to the selected memory cell, complementary voltages according to data to be written are supplied from the write driver 1105 to the selected memory cell via the common write bit lines CTW, CBW and the bit lines BT1, BB1 (BTn, BBn). Similarly, in the case of reading from the selected memory cell, the voltages of the bit lines BT1, BB1 (BTn, BBn) are complementary voltages in accordance with data stored in the memory cell. The complementary voltages are supplied to the sense amplifier 1106 via the common read bit lines CTR and CBR, the potential difference is amplified, and the data Q[0] is outputted from the input/output circuit 1107.

The word lines W1 to Wn are wired across a plurality of memory blocks 1100, and a row according to the row address signal X is selected from among the rows of the memory blocks. On the other hand, although not shown in FIG. 11, the column address signal Y is supplied from the address control circuit 1102 to the column selection circuit 1104 in each memory block which selects the column and performs the same operation as the typical memory block as described above.

Although description will be made later with reference to FIGS. 12 and 13, the unique ID is generated by the unique ID generation instruction signal IDEN.

Figure 12:
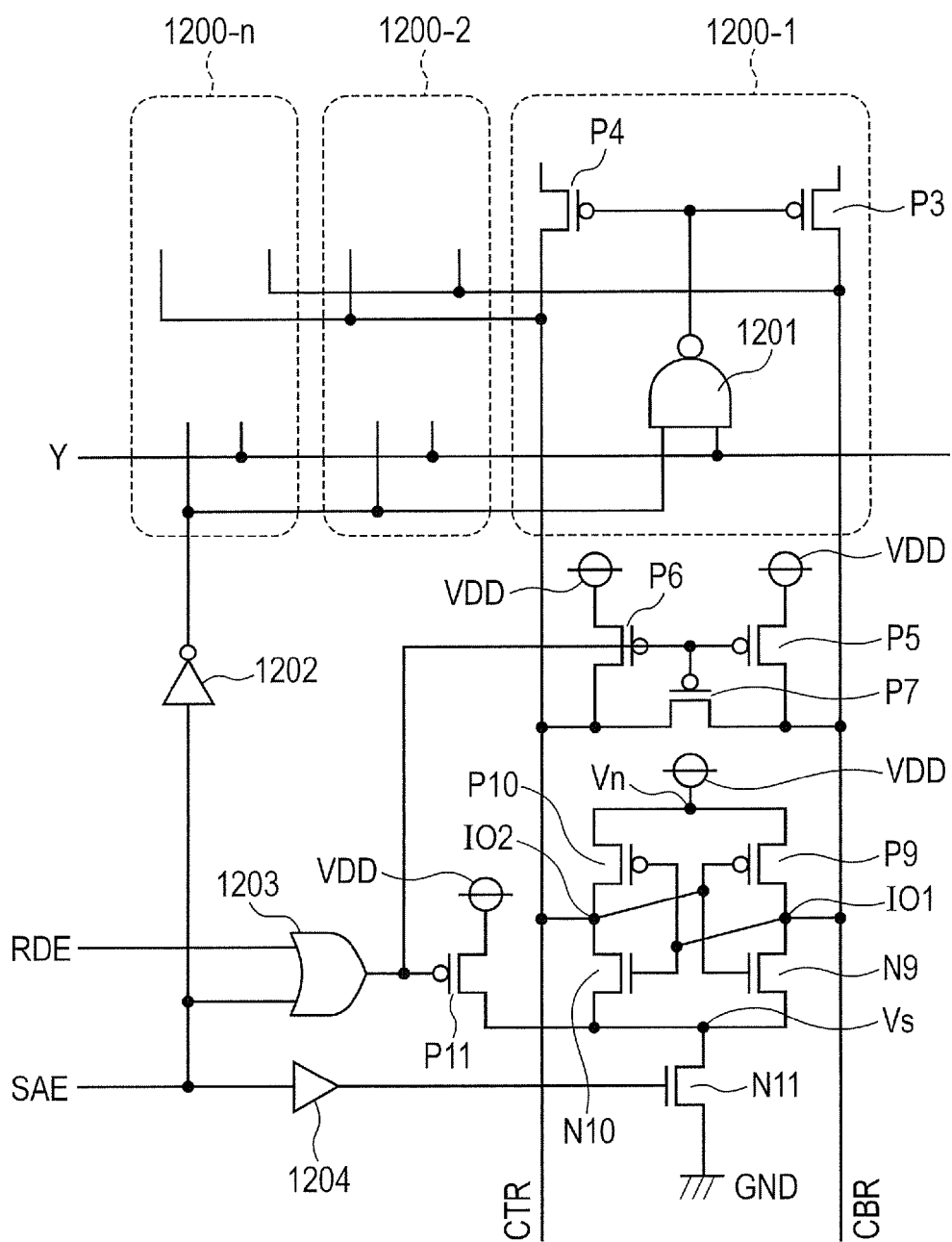
FIG. 12 is a circuit diagram showing the circuit of the main part of the SRAM according to the fourth embodiment.

FIG. 12 is a circuit diagram showing the configuration of the column selection circuit 1104 and the sense amplifier 1106 of the SRAM shown in FIG. 11. FIGS. 13A to 13G are waveform diagrams showing the operation of the circuit shown in FIG. 11.

In FIG. 11, the column selection circuit 1104 has a plurality of unit column selection circuits corresponding to the bit line pairs BL1 to BLn respectively. In FIG. 12, dashed-line blocks 1200-1 to 1200-*n* are unit column selection circuits. The circuit of the typical unit column selection circuit 1200-1 is shown in FIG. 12. Hereinafter, only the typical unit column selection circuit 1200-1 will be described, while the same applies to the other unit column selection circuits.

The unit column selection circuit 1200-1 has P-MOSFETs P3 and P4 coupled between the bit line pair BLn and the common read bit line pair and a NAND circuit 1201 which receives the column address signal Y and the inverted signal of the sense amplifier activation signal SAE. That is, the drain-source path of the P-MOSFET P4 is coupled between the bit line BTn configuring the bit line pair BLn and the common read bit line CTR, and the drain-source path of the P-MOSFET P3 is coupled between the bit line BBn configuring the bit line pair BLn and the common read bit line CBR. The gates of the P-MOSFETs P3 and P4 are coupled in common, and receive a selection signal generated by the NAND circuit 1201. The P-MOSFETs P3 and P4 function as column switches for selectively coupling between the bit lines BTn, BBn and the common read bit lines CTR, CBR in accordance with the selection signal from the NAND circuit 1201.

While FIG. 12 shows one column address signal Y supplied to the NAND circuit 1201 to avoid complicating the drawing, it is to be understood that a plurality of column address signals Y are supplied to the NAND circuit 1201. With this, if the combination of the voltages (levels) of the column address signals is a predetermined combination and the sense amplifier activation signal SAE is at the low level, the NAND circuit 1201 generates a low-level selection signal. The low-level selection signal turns on the P-MOSFETs P3, P4 as column switches, so that the bit lines BTn, BBn are electrically coupled to the common read bit lines CTR, CBR.

The other unit column selection circuits 1200-2 to 1200-*n* have the same configuration as the unit column selection circuit 1200-1. However, there is a difference in the output condition of the low-level selection signal from the NAND circuit 1201 among the unit column selection circuits 1200-2 to 1200-*n*. That is, the combination of the potentials of the column address signals Y differs among the NAND circuits 1201. Thereby, by the column address signal Y, one unit column selection circuit of the unit column selection circuits 1200-1 to 1200-*n* couples the bit lines corresponding to (coupled to) the unit column selection circuit to the common read bit lines CTR, CBR.

The sense amplifier 1106 coupled to the common read bit lines CTR and CBR has a sense amplifier circuit and a precharge circuit for precharging the common read bit lines CTR and CBR. The precharge circuit includes P-MOSFETs P6, P5 whose source-drain paths are coupled between the power supply voltage VDD and the common read bit lines CTR, CBR and a P-MOSFET P7 whose source-drain path is coupled between the common read bit lines CTR and CBR.

A precharge control signal is supplied to the gates of the P-MOSFETs P5 to P7. When the precharge control signal becomes the low level, the P-MOSFETs P5 to P7 turn on and precharge the common read bit lines CTR and CBR to the power supply voltage VDD. When the P-MOSFET P7 of the P-MOSFETs P5 to P7 is turned on, the P-MOSFET P7 electrically shorts the common read bit lines CTR and CBR to equalize the voltages of the common read bit lines CTR and CBR.

The sense amplifier circuit operates so as to amplify the potential difference between the common read bit lines CTR and CBR. In this embodiment, the sense amplifier circuit has P-MOSFETs P9 and P10 and N-MOSFETs N9, N10, and N11.

The source-drain path of the P-MOSFET P9 is coupled between the power supply voltage VDD and an input/output node IO1, and the source-drain path of the N-MOSFET N9 is coupled between the input/output node IO1 and the drain of the N-MOSFET N11. Further, the gate of the P-MOSFET P9 and the gate of the N-MOSFET N9 are coupled in common to an input/output node IO2. The source-drain path of the P-MOSFET P10 is coupled between the power supply voltage VDD and the input/output node IO2, and the source-drain path of the N-MOSFET N10 is coupled between the input/output node IO2 and the drain of the N-MOSFET N11. Further, the gate of the P-MOSFET P10 and the gate of the N-MOSFET N10 are coupled in common to the input/output node IO1.

The source of the N-MOSFET N11 is coupled to the ground voltage GND, and a control signal based on the sense amplifier activation signal SAE is supplied to the gate of the N-MOSFET N11. The input/output node IO1 is coupled to the common read bit line CBR, and the input/output node IO2 is coupled to the common read bit line CTR.

With the above coupling, the P-MOSFET P9 and the N-MOSFET N9 configure a first inverter circuit, and the P-MOSFET P10 and the N-MOSFET N10 configure a second inverter circuit. The input of the first inverter circuit is coupled to the input/output node IO2 corresponding to the output of the second inverter circuit, and the input of the second inverter circuit is coupled to the input/output node IO1 corresponding to the output of the first inverter circuit. That is, the first and second inverter circuits configure a latch circuit. With this, when the N-MOSFET N11 which operates as a switch in response to the sense amplifier activation signal SAE is turned on, the latch circuit operates so as to amplify the potential difference between the input/output nodes IO1 and IO2. That is, the latch circuit operates so as to amplify the potential difference between the common read bit lines CTR and CBR.

The sense amplifier 1106 includes a control circuit which receives the read enable signal RDE and the sense amplifier activation signal SAE from the control unit 1103 (in FIG. 11) and generates control signals for controlling the sense amplifier, the precharge circuit, and the unit column selection circuits. As a matter of course, the control circuit may be provided in the control unit 1103 shown in FIG. 11. The control circuit has a buffer circuit 1204 which receives the sense amplifier activation signal SAE as a control signal and generates a control signal for the N-MOSFET N11 which functions as the switch and an inverter circuit 1202 which receives the sense amplifier activation signal SAE and generates a selection signal for the unit column selection circuits 1200-1 to 1200-n.

Further, the control circuit has a NOR circuit 1203 which receives the read enable signal RDE and the sense amplifier activation signal SAE. The output of the NOR circuit 1203 is supplied to the gates of the P-MOSFETs P5 to P7 configuring the precharge circuit. Further, the output of the NOR circuit 1203 is also supplied to the gate of a P-MOSFET P11 whose source-drain path is coupled between the drain of the N-MOSFET N11 and the power supply voltage VDD.

At the time of precharging the common read bit lines CTR and CBR, the P-MOSFET P11 is turned on, which raises the drain of the N-MOSFET N11 to the power supply voltage VDD, that is, raises the sources of the N-MOSFETs N9 and N10 to the power supply voltage VDD. Thereby, the power supply voltage VDD is applied to the power supply voltage node Vn and the ground voltage node Vs of the latch circuit at the time of precharging, which can destroy the stable state of the latch circuit configuring the sense amplifier circuit.

In FIG. 12, the common write bit lines CTW and CBW are not shown.

FIGS. 13A to 13G show the waveforms of signals shown in FIG. 11. FIG. 13A shows the waveform of the unique ID generation instruction signal IDEN, FIG. 13B shows the waveform of the clock signal CLK, and FIG. 13C shows the waveform of the address signal A. FIG. 13D shows the column address signal Y, and FIG. 13F shows changes in the voltages of the common read bit lines CTR and CBR. Further, FIG. 13E shows the waveform of the read enable signal RDE generated by the control unit 1103 (in FIG. 11), and FIG. 13G shows the waveform of the sense amplifier activation signal SAE generated by the control unit 1103.

The read enable signal RDE and the sense amplifier activation signal SAE are generated by the control unit 1103, based on the clock signal CLK, the output enable signal CEN, the write enable signal WEN, and the unique ID generation instruction signal IDEN. As with the read enable signal RDE and the sense amplifier activation signal SAE, the write enable signal WTE and the address control signal TDEC shown in FIG. 11 are also generated by the control unit 1103, based on the clock signal CLK, the output enable signal CEN, the write enable signal WEN, and the unique ID generation instruction signal IDEN. The control unit 1103 can be implemented by combining a plurality of logic circuits.

Next, the operation of the SRAM according to this embodiment will be described based on the waveforms shown in FIGS. 13A to 13G.

Although not restricted, the SRAM according to this embodiment operates in synchronization with the clock signal CLK. In FIG. 13, Tr is the period of the read operation (Read), and Ti is the period of the unique ID generation operation (ID generation). Tp is the period of an operation prior to the read operation (Read).

Figure 13:
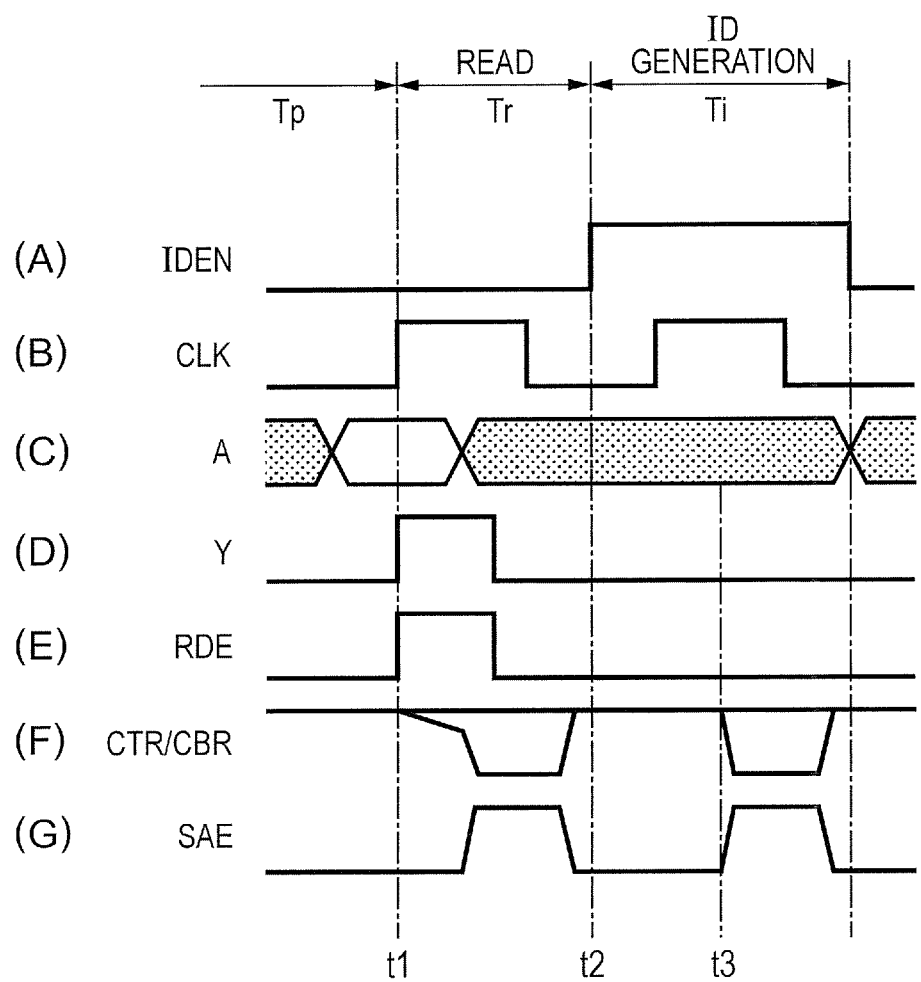
FIGS. 13A to 13G are waveform diagrams showing the operation of the SRAM according to the fourth embodiment.

Since the SRAM operates in synchronization with the clock signal CLK, when the potential of the clock signal CLK (FIG. 13B) rises at time t1 in FIG. 13, the address control signal TDEC occurs. When the address control signal TDEC occurs, the address control circuit 1102 (in FIG. 11) imports the address signal A (FIG. 13C), and generates the row address signal X and the column address signal Y.

Based on the generated row address signal X, one word line is selected from among the word lines W1 to Wn and raised to the high level by the row selection circuit 1101 (in FIG. 11). During the period Tp prior to the read operation, the bit line pairs BL1 to BLn are precharged. For example, if the word line W1 is selected and raised to the high level by the row selection circuit 1101, electric charges precharged in the bit line pairs BL1 to BLn are discharged in accordance with data stored in the memory cells MC coupled to the word line W1, and the potentials of the bit line pairs are determined, respectively.

Based on the column address signal Y (FIG. 13D), a bit line pair is selected from among the bit line pairs BL1 to BLn and coupled to the common read bit lines CTR and CBR by the column selection circuit 1104 (in FIG. 11). In FIG. 13D, the column address signal supplied to the NAND circuit 1201 in the unit column selection circuit 1200-1 is at the high level. In this case, the bit lines BT1, BB1 are coupled to the common read bit lines CTR, CBR via the P-MOSFETs P3, P4 which operate as column switches.

The operation (write operation or read operation) is terminated in the period Tp prior to the read operation (Read). Accordingly, before time t1, the write enable signal WEN and the output enable signal CEN are, for example, at the low level. Thereby, before time t1, the read enable signal RDE and the sense amplifier activation signal SAE are both at the low level. Accordingly, before time t1, the output of the NOR circuit 1203 are at the low level, which turns on the P-MOSFETs P5 to P7 in the precharge circuit. The common read bit lines CTR, CBR are precharged via the P-MOSFETs P5, P6 by the power supply voltage VDD. Further, the P-MOSFET P7 shorts the common read bit lines CTR and CBR so as to decrease the potential difference between the common read bit lines CTR and CBR.

Since the sense amplifier activation signal SAE is at the low level, the N-MOSFET N11 as a switch for activating the sense amplifier is turned off. On the other hand, the P-MOSFET P11 for precharge is turned on by the output of the NOR circuit 1203. Accordingly, the ground voltage node Vs of the latch circuit in the sense amplifier circuit is precharged via the P-MOSFET P11 by the power supply voltage VDD. This decreases the potential difference between the power supply voltage node Vn and the ground voltage node Vs of the sense amplifier circuit, and destroys the stable state of the sense amplifier circuit.

At time t1, when the read operation (Read) is specified by the output enable signal CEN and the write enable signal WEN, the read enable signal RDE (FIG. 13E) changes to the high level accordingly. After a lapse of a predetermined time from the change of the read enable signal RDE to the high level, the sense amplifier activation signal SAE (FIG. 13G) is changed from the low level to the high level.

When the read enable signal RDE changes to the high level, the output of the NOR circuit 1203 also changes to the high level, which turns off the P-MOSFETs P5 to P7 in the precharge circuit and also turns off the P-MOSFET P11 for precharge. Accordingly, the potential of the common read bit line CTR (FIG. 13F) changes in accordance with the potential of the bit line BT1 coupled via the P-MOSFET P4, and the potential of the common read bit line CBR changes in accordance with the potential of the bit line BB1 coupled via the P-MOSFET P3.

When the sense amplifier activation signal SAE changes from the low level to the high level, the N-MOSFET N11 for activating the sense amplifier turns on, and the potential difference between the common read bit lines CTR and CBR is amplified. The amplified result is transferred to the input/output circuit 1107 via the common read bit lines CTR and CBR.

The sense amplifier activation signal SAE changes to the low level after a lapse of a predetermined time from the change to the high level. The read enable signal RDE changes to the low level after a lapse of a predetermined time from the change to the high level.

Thus, data stored in the memory cell is read. When the read enable signal RDE and the sense amplifier activation signal SAE change to the low level, the P-MOSFETs P5 to P7 in the precharge circuit are turned on, and the P-MOSFET P11 for precharge is also turned on. Thereby, again, the common read bit lines CTR and CBR are precharged, the potentials are equalized, and the stable state of the latch circuit in the sense amplifier is destroyed so that the latch circuit prepares for the next operation.

Next, the unique ID generation operation will be described. The SRAM is instructed by the unique ID generation instruction signal IDEN to generate the unique ID. In this embodiment, this instruction is given by changing the unique ID generation instruction signal IDEN to the high level.

In FIG. 13, at time t2, the unique ID generation instruction signal IDEN is changed from the low level to the high level. That is, at time t2, the unique ID generation operation is specified.

In response to the high level of the unique ID generation instruction signal IDEN, the control unit 1103 (in FIG. 11) recognizes that the unique ID generation operation is specified, and stops issuing the address control signal TDEC though not restricted. Thereby, even if the clock signal CLK is changed to the high level during the period Ti, the address control circuit 1102 does not import the address signal A, and does not generate the row address signal X and the column address signal Y.

Further, due to the high level of the unique ID generation instruction signal IDEN, even if the clock signal CLK is changed to the high level during the period Ti, the control unit 1103 does not change the read enable signal RDE to the high level. In this case, the control unit 1103 changes the sense amplifier activation signal SAE to the high level at time t3 after a lapse of a predetermined time from the change of the clock signal CLK to the high level.

Since the read enable signal RDE does not change to the high level, the read enable signal RDE and the sense amplifier activation signal SAE of the low level are supplied to the NOR circuit 1203 during a period between the change of the sense amplifier activation signal SAE to the low level in the period Tr and time t3. Accordingly, the NOR circuit 1203 generates the low-level control signal during this period.

By the low-level control signal, the P-MOSFETs P5 to P7 in the precharge circuit and the P-MOSFET P11 for precharge are turned on. That is, the common read bit lines CTR, CBR are coupled and continuously precharged to the power supply voltage VDD by the P-MOSFETs P6, P5. Further, during this period, the turned-on P-MOSFET P7 shorts the common read bit lines CTR and CBR to equalize the potentials. Further, the ground voltage node Vs of the latch circuit in the sense amplifier circuit is precharged to the power supply voltage VDD by the turned-on P-MOSFET P11, and the stable state of the latch circuit in the sense amplifier circuit is destroyed.

At time t3, when the sense amplifier activation signal SAE changes from the low level to the high level, the NOR circuit 1203 outputs the high-level control signal, which turns off the P-MOSFETs P5 to P7 in the precharge circuit and also turns off the P-MOSFET P11 for precharge.

On the other hand, when the sense amplifier activation signal SAE changes to the high level, the N-MOSFET N11 as the switch for activating the sense amplifier circuit turns on. Thereby, the sense amplifier circuit starts to operate. At this time, the sense amplifier activation signal SAE is inverted by the inverter circuit 1202, and the inverted selection signal is supplied to the NAND circuit 1201 in each of the unit column selection circuits 1200-1 to 1200-*n*.

The selection signal obtained by inverting the phase of the sense amplifier activation signal SAE functions as a control signal for instructing the unit column selection circuits 1200-1 to 1200-*n* to electrically separate the bit line pairs from the common read bit line pair. That is, by the low-level selection signal, the NAND circuit 1201 in each of the unit column selection circuits supplies the high-level signal to the P-MOSFETs P3 and P4 functioning as column switches.

Thereby, the bit line pairs BL1 to BLn are separated from the common read bit lines CTR and CBR by the P-MOSFETs P3 and P4.

When the sense amplifier circuit starts to operate, the potentials of the common read bit lines CTR and CBR as the inputs (IO1, IO2) of the sense amplifier circuit are in a state of being precharged to the power supply voltage VDD. Therefore, the potential difference between the inputs of the sense amplifier circuit does not occur. In this case, the sense amplifier circuit changes to a state according to variations in characteristics of the P-MOSFETs P9 and P10 and the N-MOSFETs N9 and N10 configuring the sense amplifier circuit. That is, the potentials of the input/output nodes IO1 and IO2 are determined in accordance with variations in characteristics of the P-MOSFETs P9 and P10 and the N-MOSFETs N9 and N10 caused by variations during manufacturing. The potential difference between the input/output nodes IO1 and IO2 is amplified by positive feedback of the latch circuit configured with the inverter circuits, and a stable state is obtained. Thus, the generated unique ID is transferred to the input/output circuit 1107 via the common read bit lines CTR and CBR, and used by the CPU or the like.

In this embodiment, the unique ID is generated using the variations of elements such as MOSFETs configuring the sense amplifier circuit.

The unique ID may be generated in each of the memory blocks shown in FIG. 11. In this case, a plurality of unique IDs can be obtained.

Further, while this embodiment has been described by way of example of the sense amplifier circuit having the latch circuit, the invention is not limited thereto. For example, a first MOSFET whose gate is coupled to the common read bit line CTR and a second MOSFET whose gate is coupled to the common read bit line CBR are prepared. The sources of the prepared first and second MOSFETs are coupled to each other, a current source is provided at the coupling point, and the difference between currents flowing through the first and second MOSFETs is detected by a sense amplifier circuit. The invention is also applicable to such a sense amplifier circuit. In this case, the unique ID can be generated using variations in characteristics of the first and second MOSFETs.

Further, while this embodiment has been described by way of example of the SRAM, a nonvolatile memory, a DRAM, or a flash memory may be used.

According to the fourth embodiment, the sense amplifier circuit amplifies the potential difference between the bit lines of the common read bit line pair which are precharged to the same voltage. Accordingly, the sense amplifier changes to the state according to the characteristics of the MOSFETs configuring the sense amplifier. This state is used as the unique ID by the CPU or the like.

Fifth Embodiment

Figure 14:
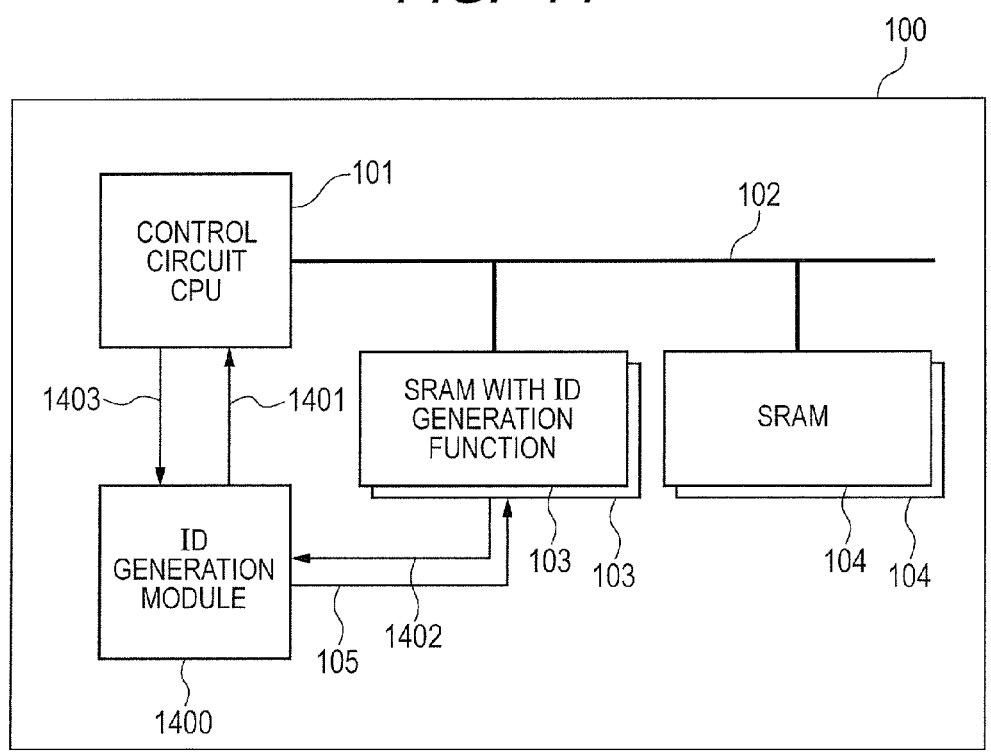
FIG. 14 is a block diagram showing the configuration of a semiconductor integrated circuit device according to a fifth embodiment.

FIG. 14 is a block diagram showing the configuration of a semiconductor integrated circuit device according to the fifth embodiment. The semiconductor integrated circuit device shown in FIG. 14 is similar to that shown in FIG. 1, and therefore the differences from FIG. 1 will be mainly described.

In the semiconductor integrated circuit device shown in FIG. 1, the CPU 101 supplies the unique ID generation instruction signal 105 to the SRAM 103 with the ID generation function, and the unique ID generated by the SRAM 103 is supplied to the CPU 101 via the bus 102. On the other hand, in the fifth embodiment, an ID generation module 1400 is formed in the semiconductor chip 100 of the semiconductor integrated circuit device.

In this embodiment, the CPU 101 supplies a unique ID generation instruction signal 1403 to the ID generation module 1400, and the ID generation module 1400 supplies the unique ID generation instruction signal 105 or IDEN to the SRAM 103 with the ID generation function, in response to the unique ID generation instruction signal 1403. The SRAM 103 with the ID generation function has the same configuration as the SRAM 103 with the ID generation function shown in FIG. 1.

Upon receiving the unique ID generation instruction signal 105 (IDEN), a plurality of SRAMs 103 with the ID generation function generate the unique ID as described in the above embodiments. The generated unique ID is supplied to the ID generation module 1400 via an individual signal line instead of the bus 102. The ID generation module 1400 generates the unique ID based on the unique ID supplied from each SRAM 103 with the ID generation function, and supplies it as a unique ID 1401 to the CPU 101. This makes it possible to generate a more robust unique ID. In FIG. 14, the CPU 101 controls the ID generation module 1400. To clearly show the control, the CPU 101 is written as a control circuit CPU in FIG. 14.

The third embodiment is an embodiment relating to the nonvolatile memory. In FIG. 14, the SRAM 104 can be replaced with the nonvolatile memory for storing data beforehand, and the SRAM 103 can be replaced with the ID generation nonvolatile memory. In this case, the nonvolatile memory 104 includes the nonvolatile cell shown in FIGS. 10A and 10B, and the ID generation nonvolatile memory includes the ID generation cell shown in FIG. 10C.

While the invention made above by the present inventors has been described specifically based on the illustrated embodiments, the present invention is not limited thereto, and various changes and modifications can be made thereto without departing from the spirit and scope of the invention.

What is claimed is:

1. A semiconductor integrated circuit device comprising:
    a memory cell including: a holding circuit which has a plurality of MOSFETs and a pair of input/output nodes and operates with a first voltage as an operating voltage; and a pair of transfer MOSFETs which are coupled to the input/output nodes respectively and whose gates receive a selection signal; and
    a voltage generation circuit for generating a second voltage which is higher than the first voltage in terms of an absolute value,
    wherein in response to a unique ID generation instruction, the second voltage is applied to the gates of the transfer MOSFETs, a third voltage is supplied to the input/output nodes via the transfer MOSFETs, and then the second voltage applied to the gates of the transfer MOSFETs is lowered to a voltage that is lower than the first voltage in terms of an absolute value.

2. The semiconductor integrated circuit device according to claim 1, wherein the holding circuit is a latch circuit comprising the MOSFETs.

3. The semiconductor integrated circuit device according to claim 2, wherein the third voltage is equal to the first voltage.

4. A semiconductor integrated circuit device comprising:
    a plurality of memory cells arranged in a matrix, each of the memory cell comprising: a holding circuit which has a plurality of MOSFETs and a pair of input/output nodes and operates with a first voltage as an operating voltage; and a pair of transfer MOSFETs which are coupled to the input/output nodes respectively and whose gates receive a selection signal;

a plurality of word lines arranged in respective rows of the matrix and each coupled to gates of pairs of transfer MOSFETs in a plurality of memory cells arranged in a corresponding row;

a plurality of bit line pairs arranged in respective columns of the matrix and each coupled to pairs of transfer MOSFETs in a plurality of memory cells arranged in a corresponding column;

a row selection circuit for selecting a word line from among the word lines;

a column selection circuit for selecting a bit line pair from among the bit line pairs; and a voltage generation circuit for generating a second voltage which is higher than the first voltage in terms of an absolute value, wherein in response to a unique ID generation instruction, the second voltage is applied to the word line selected by the row selection circuit, a third voltage is applied to the bit line pair selected by the column selection circuit, and then the second voltage applied to the selected word line is lowered to a voltage that is lower than the first voltage in terms of an absolute value.

5. The semiconductor integrated circuit device according to claim 4, wherein the holding circuit is a latch circuit comprising the MOSFETs.

6. The semiconductor integrated circuit device according to claim 5, wherein the third voltage is equal to the first voltage.

7. The semiconductor integrated circuit device according to claim 6, wherein the voltage generation circuit is a booster circuit for boosting the first voltage.

8. The semiconductor integrated circuit device according to claim 7, further comprising a CPU for providing the unique ID generation instruction.

* * * * *